United States Patent [19]
Lev

[11] Patent Number: 5,764,084
[45] Date of Patent: Jun. 9, 1998

[54] TIME MULTIPLEXED RATIOED LOGIC

[75] Inventor: Lavi A. Lev, San Jose, Calif.

[73] Assignee: Microunity Systems Engineering, Inc., Sunnyvale, Calif.

[21] Appl. No.: 819,179

[22] Filed: Mar. 17, 1997

Related U.S. Application Data

[62] Division of Ser. No. 292,799, Aug. 17, 1994, Pat. No. 5,612,638.

[51] Int. Cl.[6] .................... H03K 19/00; H01L 25/00
[52] U.S. Cl. .................... 326/101; 326/21; 326/98; 357/206
[58] Field of Search ............... 326/98, 21, 101; 357/206, 208, 210, 920, 930

[56] References Cited

U.S. PATENT DOCUMENTS

| | | | |
|---|---|---|---|
| 4,771,327 | 9/1988 | Usui | 326/101 |
| 5,138,197 | 8/1992 | Kuwana | 326/101 |
| 5,510,636 | 4/1996 | Murata | 257/206 |
| 5,581,202 | 12/1996 | Yano et al. | 326/101 |

*Primary Examiner*—Edward P. Westin
*Assistant Examiner*—Richard Roseen
*Attorney, Agent, or Firm*—McDermott, Will & Emery

[57] ABSTRACT

A robust family of pre-conditioned complementary CMOS logic elements using scaled MOSFETs and a single clock phase which may be easily interconnected to form high speed logic networks. The family includes both N-type and P-type pre-conditioned logic elements using a skewed complementary CMOS structure to achieve low power and high speed. The logic elements achieve next generation CMOS performance yet are manufactured using present day processes and equipment. Logic element implementation is described in detail. A method for scaling the MOSFETs according to the present invention is provided, and several routing methods for reducing interconnection cross-talk are set forth.

6 Claims, 10 Drawing Sheets

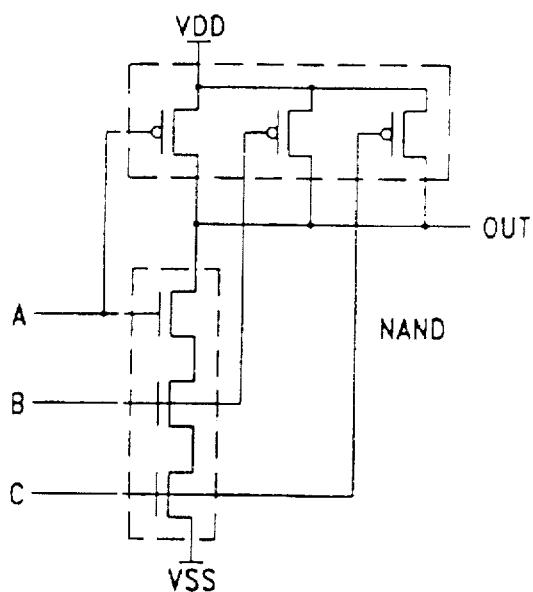
FIG.−1
(PRIOR ART)
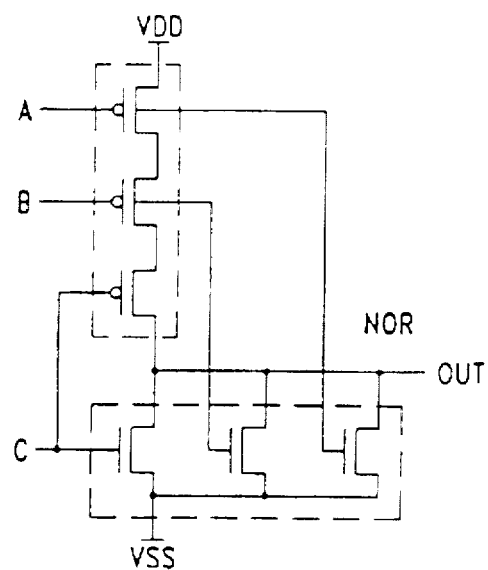
FIG.−2
(PRIOR ART)
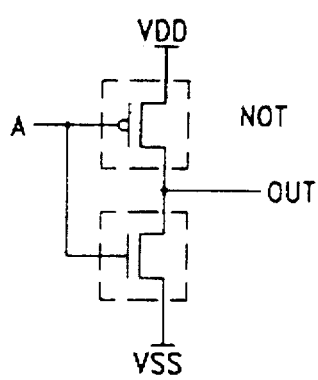
FIG.−3
(PRIOR ART)
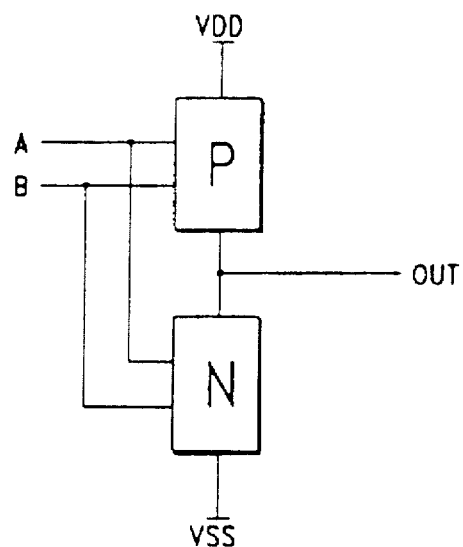
FIG.−4
(PRIOR ART)

TIME MULTIPLEXED RATIOED LOGIC

This is a divisional of application Ser. No. 08/292,799, filed Aug. 17, 1994, now U.S. Pat. No. 5,612,638.

BACKGROUND OF THE INVENTION

1. Field of the Invention

This invention relates to pre-conditioned CMOS gates and more specifically to such gates having improved switching speed, noise immunity, reduced power consumption and simplified layout.

2. Previous Art

Dynamic CMOS logic gates ("logic elements") have been used in applications where speed and reduced silicon area are at a premium, such as in high speed arithmetic units and state vector generation circuits (Shoji, CMOS Digital Circuit Technology, Prentice Hall, 1988, pages 61, 210). On the other hand, static CMOS circuits have been preferred when simplicity and reliability of operation are required (id., at page 61).

At least one researcher has suggested that static CMOS circuits and a single phase clocking system can be modified to exhibit the speed, power and silicon area advantages of dynamic CMOS (id., pages 377, 378 and FIG. 8.18). However, to date no one has succeeded in fulfilling the promise of the suggestion, and in fact, the same researcher has expressed the view that it would be "risky" to construct an entire pipelined system by dynamic logic and dynamic latches (id., at page 236).

What is needed is a dynamic CMOS logic element which can be used in pipelined circuits and which exhibits improved switching speed.

What is also needed is a dynamic CMOS logic element having improved switching speed and noise immunity.

What is also needed is a dynamic CMOS logic element having improved switching speed, improved noise immunity and reduced power consumption.

Finally, what is needed is a dynamic CMOS logic element having improved speed and noise immunity, reduced power consumption and simplified layout.

SUMMARY OF THE INVENTION

It is an object of this invention to provide a robust family of pre-conditioned complementary CMOS logic elements which exhibit next generation operating speed and power consumption and are produced using existing manufacturing processes.

It is also an object of this invention to provide a robust family of pre-conditioned complementary CMOS logic elements which can be interconnected into large, reliable logic networks.

It is a further object of this invention to provide such a logic family which exhibits improved speed and noise immunity, reduced power consumption, enjoys simplified circuit layout, and lends itself for use in a 'CAD' place-and-route environment.

It is a further object of this invention to provide methods for scaling the MOSFETs of such a family of devices and for routing.

In accordance with the above objects and those that will be mentioned and will become apparent below, a two-stage preconditioned N-type complementary CMOS logic circuit using scaled MOSFETs and a single clock phase comprises:

a first stage pre-conditioned N-type logic element having $L_1$ first stage input lines, a first stage output line, and a return line, and formed by $L_1$ first stage complementary MOSFET pairs, $L_1$ being a positive integer, each pair including a P-channel charge MOSFET and an N-channel evaluation MOSFET, each first stage input line being connected to the gate terminals of a different first stage complementary pair, the charge MOSFETs forming a charge subcircuit connected between a supply voltage $V_{DD}$ and the first stage output line and the first stage evaluation MOSFETs forming a first stage evaluation subcircuit connected between the first stage output line and the return line to provide a first defined logical function of the first stage input lines at the first stage output line, the first stage logic element also including a P-channel pre-condition MOSFET having a source-to-drain path connected between the supply voltage $V_{DD}$ and the first stage output line and an N-channel ground switch MOSFET having a source-to-drain path connected between a supply voltage $V_{SS}$ and the return line, and also including a clock input line connected to the gate terminals of the pre-condition and the ground switch MOSFETs, each first stage MOSFET having a width, and the width of each first stage N-channel MOSFET being substantially greater than the width of each first stage P-channel MOSFET; and a second stage static P-type logic element having $L_2$ second stage input lines and a second stage output line, one second stage input line being connected to the first stage output line, the second stage logic element being formed of $L_2$ second stage complementary MOSFET pairs, $L_2$ being a positive integer, each second stage complementary pair including a P-channel evaluation MOSFET and an N-channel discharge MOSFET, each second stage input line being connected to the gate terminals of a different second stage complementary pair, the second stage evaluation MOSFETs forming a second stage evaluation subcircuit connected between the supply voltage $V_{DD}$ and the second stage output line, and the discharge MOSFETs forming a discharge subcircuit connected between the second stage output line and a supply voltage $V_{SS}$ to provide a second defined logical function of the second stage input lines at the second stage output line, each second stage MOSFET having a width, and the width of each second stage P-channel MOSFET being substantially greater than the width of each second stage N-channel MOSFET, permitting two-stage pre-conditioned N-type logic using scaled MOSFETs and a single clock phase.

In a preferred embodiment, the width of the first stage N-channel evaluation MOSFETs is about 10 times the width of the first stage P-channel charge MOSFETs.

In another preferred embodiment, the width of the second stage P-channel evaluation MOSFETs is about 10 times the width of the second stage N-channel discharge MOSFETs.

An additional preferred embodiment includes a network of interconnected alternating pre-conditioned N-type and static P-type complementary CMOS logic elements using scaled complementary MOSFETs and a single clock phase.

It is an advantage of this invention to provide a robust family of pre-conditioned complementary CMOS logic elements which exhibit next generation operating speed and power consumption and are produced using existing manufacturing processes.

It is also an advantage of this invention to provide a robust family of pre-conditioned complementary CMOS logic elements which can be interconnected into large, reliable logic networks.

It is a further advantage of this invention to provide such a logic family which exhibits improved speed and noise immunity, reduced power consumption, enjoys simplified circuit layout, and lends itself for use in a 'CAD' place-and-route environment.

It is a further advantage of this invention to provide methods for scaling the MOSFETs of such a family of devices and for routing.

BRIEF DESCRIPTION OF THE DRAWING

For a further understanding of the objects and advantages of the present invention, reference should be had to the following detailed description, taken in conjunction with the accompanying drawing, in which like parts are given like reference numerals and wherein:

FIGS. 1–3 are schematic diagrams illustrating known complementary CMOS logic elements.

FIG. 4 is a schematic diagram representing a generic complementary CMOS logic element.

DETAILED DESCRIPTION OF THE INVENTION INTRODUCTION

Figure 5:
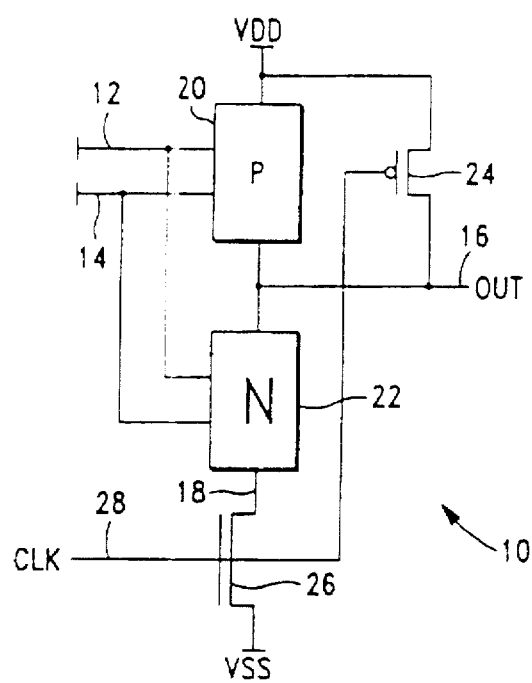
FIG. 5 is a schematic diagram of a pre-conditioned N-type complementary CMOS logic element using scaled MOSFETs and a single clock phase in accordance with one aspect of the present invention.

FIGS. 1–3 are schematic diagrams illustrating known complementary CMOS logic elements. These logic elements include the NAND, the NOR and the INVERTER ("NOT"), respectively. The illustrated logic elements have input lines and an output line. Each input line is connected to the gate terminals of a pair of complementary P and N-channel MOSFET transistors. The P-channel transistors of each complementary pair are shown enclosed within a dashed box and form a circuit connected between a supply voltage $V_{DD}$ and the logic element output line. The N-channel transistors are enclosed within a separate dashed box and form a circuit connected between the output line and a supply voltage $V_{SS}$. The P and N-channel transistors are connected to produce at the output line a desired logical function of signals present at the input lines. The P and the N-channel transistors are shown grouped within the separate dashed boxes for convenience.

FIG. 4 is a schematic diagram representing a complementary CMOS logic element having an unspecified logical function. The P and N-channel transistor circuits are replaced by solid boxes and are identified by the letters "P" and "N", respectively. The input lines are shown connected to the boxes and the boxes are connected between the power supplies and an output line. The P-channel transistors of each complementary pair are represented by the box marked "P", while the N-channel transistors are represented by the box marked "N". Each input line is connected to the gate terminals of the P and N-channel transistors of a single complementary pair. Each input line is connected to a different pair, as illustrated in FIGS. 1, 2.

The simplified representation of FIG. 4 is an alternative method for illustrating a complementary CMOS logic element and is used to improve understanding by reducing unnecessary detail. This simplified representation will be used throughout the remainder of the Specification to illustrate the invention. Individual transistors will be shown when helpful to improve understanding of a particular aspect of the invention. It will be appreciated that the number of input lines and the logical function of a logic element are determined by the requirements of a specific application. Therefore, the present invention is not limited to a particular number of input lines nor to a specific group of logical functions.

State-of-the-art complementary CMOS devices use transistors having a size of approximately 0.8μ and operating at a 3 volt $V_{DD}$ level. These devices are capable of operation at tremendous speed and at very low power. The next generation of complementary CMOS devices will use transistors of approximately 0.6μ size. The present invention provides a robust family of devices capable of attaining the speed of the proposed 0.6μ device while using the currently existing 0.8μ devices. An estimated cost of bringing a production facility on line capable of producing transistors in the 0.6µ range is approximately 200 million dollars. Thus, manufactures can attain next generation performance without the sizable investment in new production facilities and untried technology.

Additionally, the present invention allows operation at state-of-the-art speed performance levels when operated at a 2 volt $V_{DD}$ level. The reduction of $V_{DD}$ from 3 to 2 volts is equivalent to a 45 percent reduction in operating power (watts). This conclusion is supported as follows-operating power is a function of the product of Capacitance×Voltage-squared×Operating Frequency ("C×$V^2$×$F_{REQ}$"), and 2×2=4 is slightly less than 45 percent of 3×3=9. Thus, the present invention is capable of attaining state-of-the-art speed performance at slightly less than 45 percent of the operating power required by complementary CMOS devices such as those illustrated in FIGS. 1–3.

Devices incorporating the teachings of the present invention are therefore able to provide next generation 0.6µ technology operating speeds when operated at 3 volts. Alternatively, the present invention can cut operating power by more than half when operated at current 0.8µ technology speeds and at 2 volts.

Pre-conditioned N-type Complementary CMOS Logic Element

The invention will now be described with respect to FIG. 5, a schematic diagram illustrating a pre-conditioned N-type complementary CMOS logic element, according to one aspect of the invention. The logic element is identified generally by the numeral 10, uses scaled MOSFETs and a single clock phase and includes two input lines 12, 14. Logic element 10 also includes two complementary MOSFET pairs, each pair including a P-channel charge MOSFET and an N-channel evaluation MOSFET. Each input line is connected to the gate terminals of a different MOSFET pair. The logic element 10 includes an output line 16 and a return line 18.

The charge MOSFETs form a charge circuit 20 connected between a supply voltage $V_{DD}$ and the output line 16. The evaluation MOSFETs form an evaluation circuit 22 connected between the output line 16 and the return line 18 to provide a defined logical function of the input lines at the output line.

The source-to-drain path of a P-channel pre-condition MOSFET 24 is connected between the supply voltage $V_{DD}$ and the output line 16. The source-to-drain path of an N-channel ground switch MOSFET 26 is connected between a supply voltage $V_{SS}$ and the return line 18. A clock input line 28 is connected to the gate terminals of the pre-condition MOSFET 24 and the ground switch MOSFET 26.

Scaled MOSFETs

In integrated circuits utilizing submicron sized transistors having essentially equal minimum lengths, it is customary to equate the strength of each transistor to its width. The strength of a transistor is proportional to its width because for a given technology and a minimum channel length, the width determines the drive strength of the transistor. By making the transistors of an evaluation circuit much wider than those of a corresponding charge/discharge circuit, we insure that the two circuits will not "fight" each other and slow the circuit down. The inputs to a logic element switch between logic levels over an interval of time rather than all at once. During the switching interval, both the evaluation and the charge/discharge circuits are momentarily turned on while one of the circuits is in the process of being turned off. During this time when both circuits are on, they "fight" each other ("crowbar"). By making the strength of the charge/discharge circuit very "weak" (i.e., "narrow") compared to the strength of the evaluation circuit, we insure that the "fight" is minimized and that the logic element's switching speed is greatly enhanced.

In the logic element 10, the N-channel evaluation MOSFETs 22 are scaled to have width substantially greater than the width of the P-channel charge MOSFETs 20. The width of the N-channel ground switch MOSFET 26 is scaled to be essentially the same as the width of the N-channel evaluation MOSFETs 22. Thus, the output line 16, which is pre-conditioned to a high level when the clock input 28 is low, and can be rapidly discharged to a low level when the clock input 28 goes high. The N-channel evaluation circuit 22 and the ground switch 26, each being scaled to have a substantially greater strength, are effective in rapidly discharging the output line 16 when the clock input 28 goes high.

In FIG. 5 the boxes representing the P-channel charge transistors 20 and the N-channel evaluation transistors 22 are marked with the symbols "small p" and "large N", respectively. Also, the width of the N-channel ground switch transistor 26 is shown substantially greater than the width of the P-channel pre-condition transistor 24. These drawing differences are intended to illustrate the scaling of the logic element 10 transistors according to one aspect of the present invention.

It should be noted however that the width of the N-channel ground switch MOSFET 26 is not, in general, scaled to be substantially wider than the width of the P-channel pre-condition MOSFET 24. As has been explained above, the width of the ground switch 26 must approximate the width of the N-channel evaluation MOSFETs 22 in order that the pre-conditioned output line 16 can be rapidly discharged when the clock input 28 goes high. This requires that the ground switch MOSFET 26 be "strong" or "wide." The P-channel pre-condition MOSFET 24 is essentially a very narrow (i.e., "weak") device since it has nearly the entire interval during which the clock input 28 is low to pre-condition the output line 16 to a high level. Thus it is inappropriate to think of the ground switch 26 and the pre-condition MOSFET 24 as being scaled with respect to each other. The illustrated width of the ground switch MOSFET 26 is wide because it must be fast, whereas the illustrated width of the pre-condition MOSFET 24 is narrow because it can be a much slower device.

In one preferred embodiment of the pre-conditioned N-type logic element 10, the width of the N-channel evaluation MOSFETs 22 is about 10 times the width of the P-channel charge MOSFETs 20.

In another preferred embodiment of the pre-conditioned logic element 10, the width of the N-channel evaluation MOSFETs 22 is at least 2 times the width of the P-channel charge MOSFETs 20.

In yet another embodiment of the pre-conditioned N-type logic element 10, the width of the N-channel evaluation MOSFETs 22 is from 2 to 100 times the width of the P-channel charge MOSFETs 20.

In a typical embodiment of the logic element 10 illustrated in FIG. 5, the relative widths of the P-channel charge MOSFETs 20, the N-channel evaluation MOSFETs 22 and the P-channel pre-condition MOSFET 24 are 2, 20 and 5, respectively. By way of comparison on the same scale of device width, the relative widths for the P-channel charge MOSFETs and the N-channel evaluation MOSFETs of the static complementary CMOS circuits illustrated in FIG. 2 are 120 and 20, respectively. The P-channel devices of FIG. 2 are scaled to have a "strength" which is matched to the "strength" of the corresponding N-channel devices.

The comparison is useful because it illustrates the fact that the charge MOSFETs 20 in the logic element 10 of FIG. 5 serve a different purpose from those in the logic elements of FIGS. 1–3. The purpose of the charge MOSFETs 20 in FIG. 5 are to maintain a pre-conditioned high level on the output line 16 in the presence of negative-going noise during the evaluation phase of each clock interval when the clock input signal 28 is high. When the signal levels on input lines 12, 14 do not establish a path through the evaluation MOSFETs 22 between the output line 16 and the return line 18, the small charge MOSFETs 20 are effective to maintain a high level at the output line 16 in the presence of negative-going noise. The output line 16 is susceptible to such noise during the evaluation phase of the clock interval since the high clock input 28 has turned off the pre-condition MOSFET 24. Unlike in the ordinary CMOS of FIGS. 1–3, the P-channel charge MOSFETs 20 are just strong enough to provide the noise protection but not so strong that they "fight" the much wider evaluation MOSFETs 22 and ground switch 26. Also, since the charge circuit 20 is responsive to the input lines 12, 14, there is little excess current flowing between the supply $V_{DD}$ and the supply $V_{SS}$ during the brief instant after the evaluation circuit 22 begins to discharge the pre-conditioned output line 16 and the charge circuit 20 shuts off. During this "transient" instant, the "weak" charge MOSFETs 20 do not "fight" the much stronger evaluation MOSFETs 22, thus guarantying that the discharge of the pre-conditioned high output line 16 begins as soon as the clock input 28 goes high. As stated above, this reduces power and increases speed.

Static P-type Complimentary CMOS Logic Element

Figure 6:
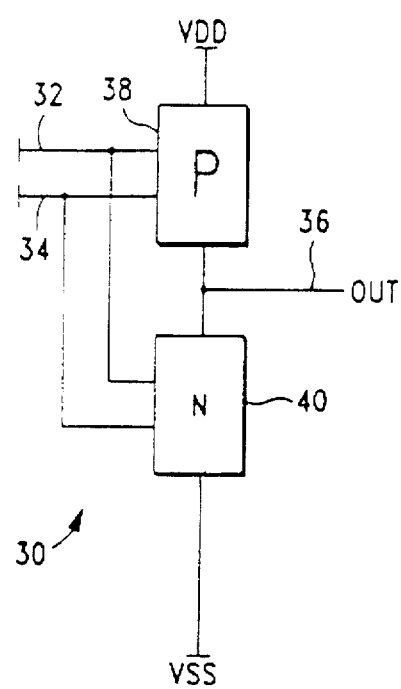
FIG. 6 is a schematic diagram of a static P-type complementary CMOS logic using scaled MOSFETs in accordance with another aspect of the present invention.

FIG. 6 illustrates a static P-type complementary CMOS logic element using scaled MOSFETs according to another aspect of the present invention, and designated generally by the numeral 30. The logic element 30 uses scaled MOSFETs and includes two input lines 32, 34. Logic element 30 also includes two complementary MOSFET pairs, each pair including a P-channel evaluation MOSFET and an N-channel discharge MOSFET. Each input line is connected to the gate terminals of a different MOSFET pair. The logic element 30 includes an output line 36.

The P-channel evaluation MOSFETs form an evaluation circuit 38 connected between the supply voltage $V_{DD}$ and the output line 36. The discharge MOSFETs form a discharge circuit 40 connected between the output line 36 and the supply voltage $V_{SS}$ to provide a defined logical function of the input lines at the output line.

Each of the MOSFET transistors in FIG. 6 has a width, and the width of the P-channel evaluation MOSFETs 38 is substantially greater than the width of the N-channel discharge MOSFETs 40. The box representing the P-channel evaluation transistors 38 includes the symbol "large P", while the box representing the N-channel discharge transistors 40 includes the symbol "small n". The size of the respective symbols "P" and "n" serves as a reminder of the fact that the MOSFETs are scaled.

In a preferred embodiment of the static P-type complimentary CMOS logic element 30, the width of the P-channel MOSFETs 38 is about 10 times the width of the N-channel MOSFETs 40.

In another preferred embodiment of the static P-type logic element 30, the width of the P-channel MOSFETs 38 is at least 2 times the width of the N-channel MOSFETs 40.

In yet another preferred embodiment, the width of the P-channel MOSFETs 38 is from 2 to 100 times the width of the N-channel MOSFETs 40.

The width of the P-channel evaluation MOSFETs 38, using the width scale used above for the devices of FIG. 5, is 12 relative to the N-channel discharge MOSFETs 40 having a width of 2. The input lines 32, 34 are driven by N-type devices such as illustrated in FIG. 5. Thus the inputs 32, 34 are pre-conditioned high and do not begin to change, if at all, until the clock input 28 goes high at the start of the evaluation phase of the clock interval. The high input lines 32, 34 will cause the weak N-channel discharge MOSFETs 40 to conduct, discharging the output line 36 to a low level. At this low level, the line 36 is sensitive to positive-going noise. The weak N-channel discharge devices need to be only wide enough to protect the output line 36 from such positive-going noise. When the much stronger P-channel evaluation MOSFETs 38 turn on, if at all, the output line 36 is quickly charged to the high level.

The difference between the static P-type complementary CMOS logic element 30 of FIG. 6 and the standard static CMOS devices illustrated in FIGS. 1–3 lies in the scaling, and in the role played by the weak N-channel discharge circuit 40 (FIG. 6). In the devices of FIGS. 1–3, the P-channel MOSFETs have a relative width of 12, and the N-channel MOSFETs have a relative width of 24. These widths are compared with logic element 30 of FIG. 6 in which the strong P-channel evaluation MOSFETs have a relative width of 12, while the weak N-channel discharge MOSFETs have a relative width of 2. The differences in relative width of the balanced strength P-channel and N-channel MOSFETs of FIGS. 1–3 are primarily the result in differences in carrier mobility between the P-type and the N-type materials. In general, the complementary MOSFETs of each pair have the same relative strength. In the present invention, on the other hand, the evaluation MOSFETs are always scaled to have relative widths substantially greater than the widths of the corresponding charge/discharge MOSFETs.

Standard static CMOS logic elements do not rely upon pre-conditioning of the output lines, the output lines continuing to switch until the inputs settle. The logic elements of the present invention do rely upon pre-conditioned output lines, and, since the inputs are usually driven by pre-conditioned output lines, the logic element relies also upon pre-conditioned inputs. The output line changes state, if at all, during the evaluation phase of the clock interval, and is sensitive to noise during the evaluation phase. The weakly scaled charge/discharge MOSFETs provide protection against the noise during that interval, and do not "fight" the stronger evaluation MOSFETs, resulting in improved noise immunity, reduced power consumption, and significantly enhanced operating speed. The cooperation between the pre-conditioned N-type complementary CMOS logic element 10 of FIG. 5 and the static P-type complementary CMOS logic element 30 of FIG. 6 will be illustrated with respect to the circuit of FIG. 7.

Two-stage Pre-conditioned N-type Complementary CMOS Logic Circuit

Figure 7:
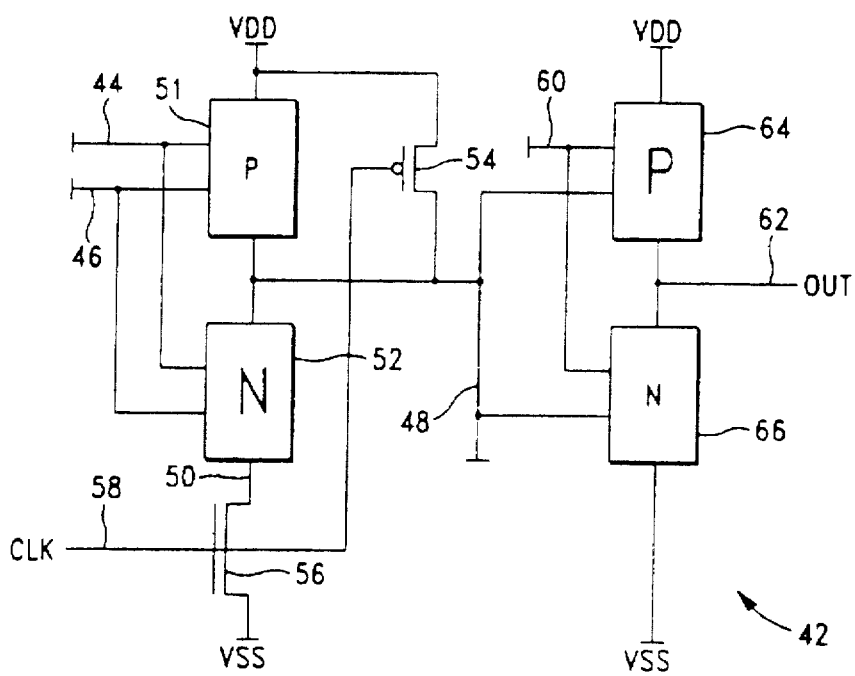
FIG. 7 is a schematic diagram illustrating a two-stage N-type pre-conditioned complementary CMOS logic circuit using scaled MOSFETs and a single clock phase in accordance with the present invention.

FIG. 7 illustrates a two-stage pre-conditioned N-type complementary CMOS logic circuit using scaled MOSFETs and a single clock phase, according to another aspect of the present invention. The two-stage pre-conditioned N-type logic circuit is designated generally by the numeral 42.

The logic circuit 42 includes a first stage pre-conditioned N-type logic element of the type illustrated in FIG. 5 and described above. The first stage logic element has two input lines 44, 46, a first stage output line 48, and a return line 50. The first stage logic element is formed of two complementary MOSFET pairs. Each MOSFET pair includes a P-channel charge MOSFET and an N-channel evaluation MOSFET. Each input line is connected to the gate terminals of a different complementary MOSFET pair. The charge MOSFETs form a charge subcircuit 51 connected between the supply voltage $V_{DD}$ and the first stage output line 48. The first stage evaluation MOSFETs form an evaluation subcircuit 52 connected between the first stage output line 48 and the return line 50 to provide a defined logical function of the first stage input lines at the first stage output line. The first stage logic element also includes a P-channel pre-condition MOSFET 54 having a source-to-drain path connected between the supply voltage $V_{DD}$ and the first stage output line 48 and an N-channel ground switch MOSFET 56 having a source-to-drain path connected between the supply voltage $V_{SS}$ and the return line 50. The first stage logic element also includes a clock input line 58 connected to the gate terminals of the pre-condition MOSFET 54 and the ground switch MOSFET 56.

Each first stage MOSFET has a width, and the width of each first stage N-channel evaluation MOSFET 52 is substantially greater than the width of each first stage P-channel charge MOSFET 51. The width of the N-channel ground switch MOSFET 56 is essentially equivalent to the width of the N-channel evaluation MOSFETs 52, as explained above with respect to FIG. 5. The P-channel pre-condition MOSFET 54 is essentially a very narrow (i.e., "weak") device.

The logic circuit 42 includes a second stage static P-type logic element of the type illustrated in FIG. 6 and described above. The second stage logic element has two second stage input lines 48, 60 and a second stage output line 62. One of the second stage input lines 48 is connected to the first stage output line 48. The second stage logic element is formed of two second stage complementary MOSFET pairs. Each second stage complementary pair includes a P-channel evaluation MOSFET and an N-channel discharge MOSFET. Each second stage input line is connected to the gate terminals of a different second stage complementary pair. The second stage evaluation MOSFETs form a second stage evaluation subcircuit 64 and are connected between the supply voltage $V_{DD}$ and the second stage output line 62. The discharge MOSFETs form a discharge subcircuit 66 which is connected between the second stage output line 62 and the supply voltage $V_{SS}$ to provide a defined logical function of the second stage input lines at the second stage output line.

Each second stage MOSFET has a width, and the width of each second stage P-channel evaluation MOSFET 64 is substantially greater than the width of each second stage N-channel discharge MOSFET 66.

In a preferred embodiment of the two-stage pre-conditioned N-type logic circuit 42, the width of the first stage N-channel evaluation MOSFETs 52 is about 10 times the width of the first stage P-channel charge MOSFETs 51.

In another preferred embodiment of the logic circuit 42, the width of the second stage P-channel evaluation MOSFETs 64 is about 10 times the width of the second stage N-channel discharge MOSFETs 66.

In another preferred embodiment of the logic circuit 42, the width of the first stage N-channel evaluation MOSFETs 52 is at least 2 times the width of the first stage P-channel charge MOSFETs 51.

In another preferred embodiment of the logic circuit 42, the width of the second stage P-channel evaluation MOSFETs 64 is at least 2 times the width of the second stage N-channel discharge MOSFETs 66.

In yet another preferred embodiment of the logic circuit 42, the width of the first stage N-channel evaluation MOSFETs 52 is from 2 to 100 times the width of the first stage P-channel charge MOSFETs 51.

In yet another preferred embodiment of the logic circuit 42, the width of the second stage P-channel evaluation MOSFETs 64 is from 2 to 100 times the width of the second stage N-channel discharge MOSFETs 66.

The input lines 44, 46 are driven by static P-type devices such as logic element 30 of FIG. 6. Thus the lines 44, 46 are low during the charge phase of each clock interval. The input lines 44, 46 will go high, if at all, during the evaluation phase following the clock input 58 going high. When the clock input 58 is low, during the charge phase, the ground switch 56 is shut off and the pre-condition MOSFET 54 is turned on, precharging the output line 48. The input line 60 is driven by the output line of a pre-conditioned N-type complementary CMOS logic element such as logic element 10 of FIG. 5. Thus input line 60 is high during the charge phase and will go low, if at all, only during the evaluation phase of the clock interval. The first stage output line 48 is also retained high during the charge phase and will go low, if at all, only during the evaluation phase of the clock interval. Thus the first stage output line is prevented from going low until the evaluation phase because the clock input 58 is low and keeps the ground switch 56 shut off.

The pre-condition MOSFET 54 charges the output line 48 during the charge phase of the clock interval. Once the clock input 58 goes high, signalling the start of the evaluation interval however, the pre-condition MOSFET 54 is shut off and, since the integrated circuit output lines are switching, the first stage output line 48 becomes sensitive to negative-going noise. If the input lines 44, 46 permit the evaluation subcircuit 52 to conduct, the output line 48 will discharge to the low level. But when the defined logic function of the first stage logic element requires that the output line 48 remain at the high level, line 48 is susceptible to negative-going noise. During this situation, the "weak" P-channel charge MOSFETs 51 serve to overcome the noise and keep the output line 48 at the high level.

The relative scaling of the MOSFETs in a typical logic circuit 42 has been described above with respect to FIGS. 5, 6.

Inverter

It will be appreciated by those skilled in the art that when a logic element includes a single complementary MOSFET pair and one input line, the logic element defines an INVERTER ("NOT"). The INVERTER can be either of the pre-conditioned type (FIG. 5) or of the static type (FIG. 6). In the two-stage pre-conditioned N-type logic circuit 42 illustrated in FIG. 7, either or both stages can be implemented as an INVERTER.

Network of Alternating Pre-conditioned and Static Logic Elements

Figure 8:
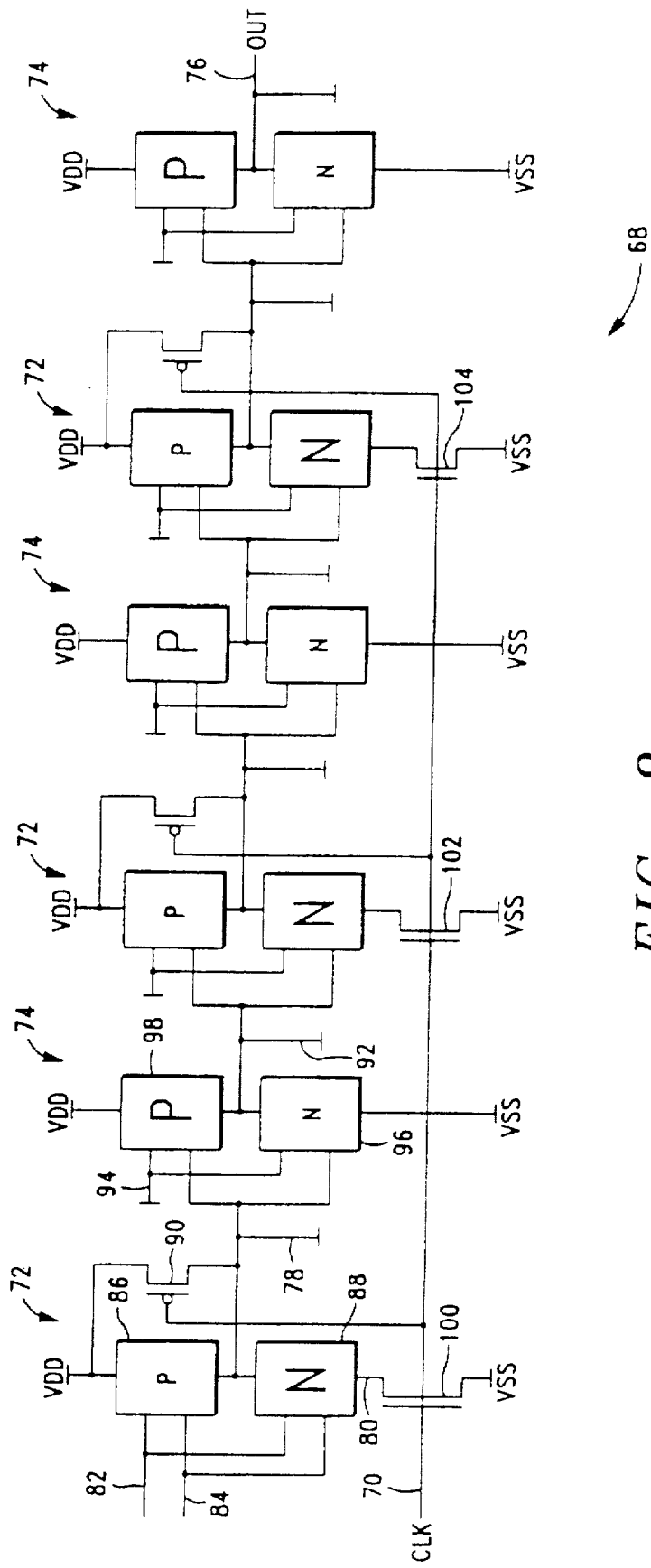
FIG. 8 is a schematic diagram of a network of interconnected alternating pre-conditioned N-type and static P-type complementary CMOS logic elements using scaled MOSFETs and a single clock phase according to the present invention and illustrating ratioed ground switches.
Figure 9:
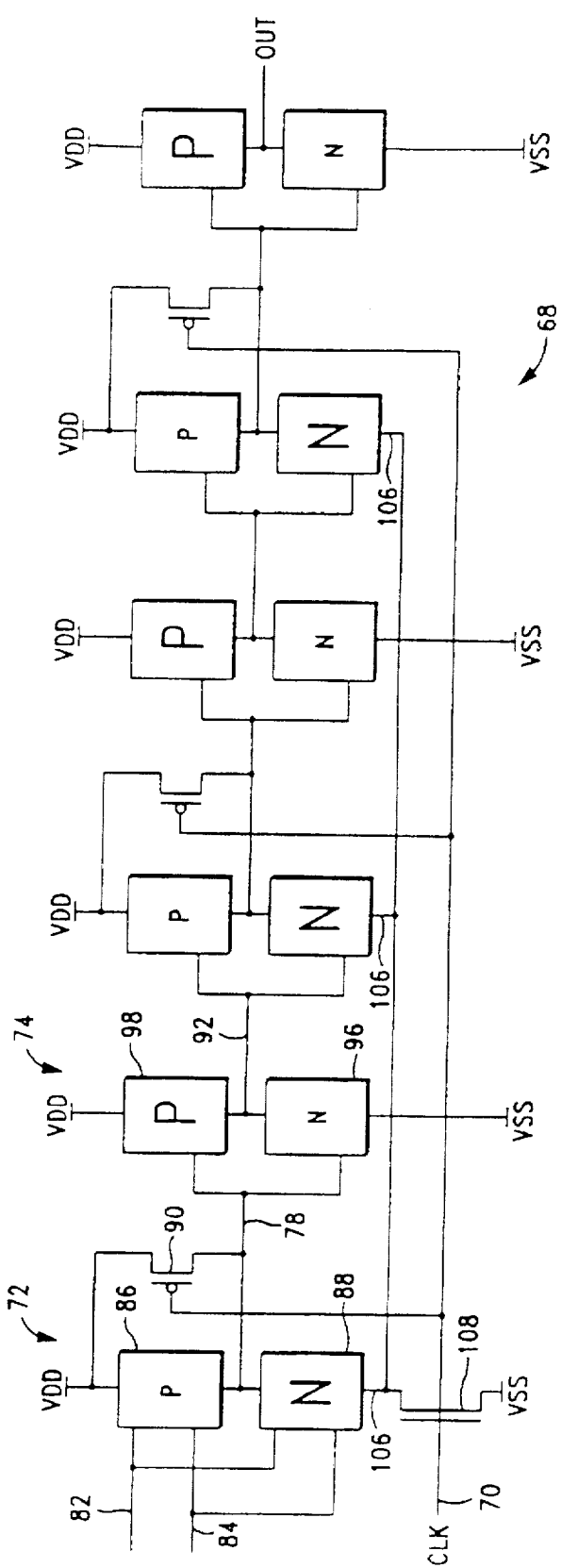
FIG. 9 is a schematic diagram of a pre-conditioned CMOS network illustrating a shared ground switch.

FIGS. 8 and 9 illustrate a network of interconnected alternating pre-conditioned N-type and static P-type complementary CMOS logic elements using scaled complementary MOSFETs and a single clock phase according to another aspect of the present invention. The network is identified generally by the numeral 68.

The network 68 includes a clock input line 70, a plurality of pre-conditioned N-type logic elements 72, a plurality of static P-type logic elements 74, and has at least one output line 76. The pre-conditioned N-type logic elements 72 are of the type illustrated in FIGS. 5 and 7 and described above. The static P-type logic elements 74 are of the type illustrated in FIGS. 6 and 7 and described above.

The number of interconnected logic elements illustrated in the network of FIGS. 8 and 9 is representative only. A typical network of this type might include hundreds or thousands of interconnected logic elements and have many network input and output lines.

Each of the pre-conditioned N-type complementary CMOS logic elements 72 has a pre-conditioned output line 78, a pre-conditioned logic element return line 80, and at least one pre-conditioned input line (two input lines 82, 84 are illustrated in FIG. 8) and provides a defined pre-conditioned logical function of the at least one pre-conditioned input line on the pre-conditioned output line.

Each pre-conditioned logic element 72 is formed of interconnected pre-conditioned complementary MOSFET pairs, each MOSFET pair includes a P-channel charge MOSFET and an N-channel evaluation MOSFET having gate terminals connected to one of the pre-conditioned input lines.

Each pre-conditioned logic element MOSFET has a width. The N-channel evaluation MOSFETs are scaled to have width substantially greater than the width of the paired P-channel charge MOSFETs.

The P-channel charge MOSFETs form a charge circuit 86 connected between the supply voltage $V_{DD}$ and the pre-conditioned output line 78 and the N-channel evaluation MOSFETs form an N-type evaluation circuit 88 connected between the pre-conditioned output line and the pre-conditioned logic element return line 80 to provide the defined pre-conditioned logical function at the pre-conditioned output line 78.

Each pre-conditioned logic element 72 also includes a P-channel pre-condition MOSFET 90 having a source-to-drain path connected between the supply voltage $V_{DD}$ and the pre-conditioned output line 78. The gate terminal of the pre-condition MOSFET 90 is connected to the clock input line 70.

Each of the static P-type complementary CMOS logic elements 74 has a static output line 92 and at least one static input line (two input lines 78, 94 are shown in FIG. 8) and provides a defined static logical function of the at least one static input line on the static output line.

Each static logic element 74 is formed of interconnected static complementary MOSFET pairs, each MOSFET pair includes a P-channel evaluation MOSFET and an N-channel discharge MOSFET having gate terminals connected to one of the static input lines.

Each static logic element MOSFET has a width. The P-channel evaluation MOSFETs are scaled to have width substantially greater than the width of the paired N-channel discharge MOSFETs.

The N-channel discharge MOSFETs form a discharge circuit 96 connected between the static output line 92 and the supply voltage $V_{SS}$ and the P-channel evaluation MOSFETs form a P-type evaluation circuit 98 connected between the static output line 92 and the supply voltage $V_{DD}$ to provide the defined static logical function at the static output line.

There is at least one network output line. A single output line 76 has been designated as the network output line in FIG. 8. It will be appreciated that the output line of any network logic element can provide a network output. A network output can be derived from any pre-conditioned N-type logic element 78, or any static P-type logic element 92 as system requirements dictate.

There are a plurality of network input lines 82, 84, 94. A network input line is any network logic element input line connected to a source originating outside the network 68.

The defined logic elements 72, 74 are interconnected to provide a defined network logical function on the at least one network output line. The pre-conditioned input lines 82, 84 are connected to sources selected from a group consisting of the network input lines and the static output lines 92. It will be appreciated that the network 68 is representational only. In practice networks according to the present invention will include hundreds or thousands of interconnected logic elements of the type described, as was stated above. Not all the logic elements will have two input lines, some will have 1, 3, 4 or more input lines and still be within the scope of the invention.

The static input lines 94 are connected to sources selected from a group consisting of the network input lines and the pre-conditioned output lines 78. Inputs to static logic elements 74 are derived from outside the network 68 or from network pre-conditioned logic element outputs 78. Inputs to pre-conditioned logic elements 72 are derived from outside the network 68 or from network static logic element outputs 92.

The interconnected logic elements define alternating pre-conditioned 72 and static 74 logic elements. Logic elements which differ from those described may be connected to the input lines or the output lines of the network 68 but are not part of the defined network.

In FIG. 8, each of the return lines 80 is connected to the drain terminal of an N-type ground switch MOSFET 100. The source terminal of the ground switch 100 is connected to the supply voltage $V_{SS}$, and the gate terminal of the ground switch 100 is connected to the clock input line 70.

Scaled MOSFETs

In a preferred embodiment of the network 68, the width of each transistor of the N-channel evaluation circuit 88 is about 10 times the width of the paired transistor of the P-channel charge circuit 86.

In a preferred embodiment of the network 68, the width of each transistor of the P-channel evaluation circuit 98 is about 10 times the width of the paired transistor of the N-channel discharge circuit 96.

In another preferred embodiment of the network 68, the width of each N-channel evaluation MOSFET 88 is at least 2 times the width of the paired P-channel charge MOSFET 86.

In another preferred embodiment of the network 68, the width of each P-channel evaluation MOSFET 98 is at least 2 times the width of the paired N-channel discharge MOSFET 96.

In yet another preferred embodiment of the network 68, the width of each N-channel evaluation MOSFET 88 is from 2 to 100 times the width of the paired P-channel charge MOSFET 86.

In yet another preferred embodiment of the network 68, the width of each P-channel evaluation MOSFET 98 is from 2 to 100 times the width of the paired N-channel discharge MOSFET 96.

Network 68 of FIG. 8 is representative of the manner in which devices according to the present invention cooperate to accomplish a system requirement. Inputs to preconditioned N-type logic elements 72 are driven by outputs from outside the network and from static P-type network logic elements 74. Inputs to static P-type logic elements 74 are driven by outputs from outside the network and from pre-conditioned N-type network logic elements 72. By definition, devices not following these rules which are connected to inputs or outputs of network logic elements are not part of the network.

The relative scaling of the MOSFET devices in the network logic elements has been discussed above. The network differs from a network of interconnected standard static CMOS logic elements such as those illustrated in FIGS. 1–3 in that the output of every other logic element in network 68 is pre-conditioned. Also, the pre-conditioned N-type logic elements are clocked with a single phase clock 70. Standard static CMOS is not clocked. And finally, the scaling differentiates between the logic elements of network 68 and an equivalent static CMOS network in which scaling is a compensation for a difference in the carrier mobility for N and P-type channels.

The network 68 differs from the known DOMINO logic network (Shoji, supra, pages 221–233) in several fundamental ways related to the superior operation of the present invention. A network of interconnected DOMINO devices requires that each static logic element be limited to an inverter only. One purpose of the inverter is to keep the DOMINO output line at a reasonable impedance level (id, page 222) to decrease the output sensitivity to negative-going noise. The present invention achieves improved noise immunity while allowing the use of any logic element having multiple input lines as well as inverters at the static P-type stages, relying upon the "weak" P-channel charge circuit 86 to improve the impedance level of the output line 78. A network 68 according to the present invention will therefore use fewer logic elements overall because one half the logic elements can be logically more complex than the DOMINO inverters. In short, a major reason why the circuits of the present invention are faster than DOMINO circuits is that the present invention uses fewer logic elements. But also, DOMINO does not rely upon the complementary static CMOS architecture as modified by the present invention. An unexpected result of the architecture of the present invention is the ability to achieve greatly enhanced speed and power performance and significantly improved noise immunity using currently available manufacturing processes, as described previously.

The network 68 differs from the known NORA logic network (id, pages 233–240) in several fundamental ways related to the superior operation of the present invention. Network 68 uses only a single clock phase 70, whereas the NORA network requires both a clock and an inverted clock. The additional clock line increases circuit layout (routing) complexity and increases system noise. NORA is "susceptible to capacitive coupling of noise signals and charge sharing. A corrupted logic level that is close to the power supply or the ground, but is not exactly, . . . may cause catastrophic failure in NORA." (Shoji, supra, at page 237). And the circuits of the present invention are less noise sensitive than NORA circuits because the present invention uses a full, complementary CMOS circuit, whereas NORA circuits do not.

The network 68 differs from an embodiment disclosed by Shoji (supra, pages 377, 378 and FIG. 8.18). Shoji uses both a clock and an inverted clock and states, at page 378, that "the circuit is designed following single-transition-polarity optimization. FETs in the dotted boxes are shrunk to small sizes and precharge/predischarge FETs are added." Shoji's N-type logic element does not include a ground switch and suffers from excessive current ("crowbar") spikes which render the circuit unusable in practice. A comparison of FIG. 7 of this Application with Shoji's FIG. 8.18 reveals that Shoji's circuit includes a clocked ("CK") pre-condition MOSFET equivalent to MOSFET 54 of FIG. 7. But the evaluation circuit MOSFETs in FIG. 8.18 are returned directly to ground without an equivalent for the clocked ground switch 56 of FIG. 7. Shoji relies upon the relative weakness of the P-channel charge circuit (dashed box) to limit the effect of current spiking. The second stage of the circuit in FIG. 8.18 requires an inverted clock ("CKB") and suffers from the same current spiking problem as the first stage. The present invention, as illustrated in FIG. 7, does not use a clocked device in the second stage. By selecting the inputs to the second stage to be outputs of pre-conditioned N-type logic elements, each of which is clocked, the static second stage can be successfully operated without a clocked device. This saves circuit layout area and does not require the routing of an inverted clock, thus reducing noise. Operating power is also conserved.

Ground Switch Connections

The ground switches may be connected to the network return lines in a variety of useful ways. A generic ground switch structure is responsive to the clock input line 70 for selectively connecting each pre-conditioned logic element return line 80 to the supply voltage $V_{SS}$.

In FIG. 8, a ground switch structure according to another aspect of the present invention includes three N-channel ground switches 100, 102, 104 each having a drain terminal connected to a different one of the pre-conditioned logic element return lines. The source terminal of each ground switch is connected to the supply voltage $V_{SS}$, and the gate terminal of each ground switch is connected to the clock input line 70.

As described above with respect to FIGS. 5 and 7, the N-channel ground switch 100 of the pre-conditioned logic element 72 is scaled to have a width essentially equivalent to the width of a transistor of the N-channel evaluation circuit 88. The width of the P-channel pre-condition MOSFET 90 is very narrow. Pre-condition MOSFET 90 must be wide enough to pre-condition the output line 78 rapidly, its size determined only by the time allowed for precharge.

Shared Ground Switches

In FIG. 9, a ground switch structure according to another aspect of the present invention includes at least two pre-conditioned logic element return lines 106 being connected to the drain terminal of a shared N-channel ground switch 108. The source terminal of the shared ground switch 108 is connected to the supply voltage $V_{SS}$, and the gate terminal of the shared ground switch 108 is connected to the clock input line 70.

The width of ground switch 108 must be large enough to satisfy the following two constraints: (1) the width must be large enough to conduct the current of all the pre-conditioned logic elements 72 connected to it via return lines 106, when the connected logic elements 72 switch simultaneously, and without slowing down the logic elements; and (2) the width must be sufficient to insure the return line 106 of each logic element 72 is at the fully on level when that particular logic element 72 switches. Not all the logic elements 72 connected to the common ground switch 108 switch at the same instant. With the aid of suitable modern design automation tools, the individual logic elements 72 which switch simultaneously can be identified and the ground switch width can be sized to conduct their combined peak currents. This approach is in contrast to that currently taken by those using shared ground switches-make the ground switch wide enough to carry the peak currents from all the connected logic elements simultaneously. This common approach results in extremely wide ground switches, increased circuit area and wasted power. Automated design tools are becoming so powerful that the individual logic elements can be selected and the resulting ground switch width made significantly less than what has been achieved previously. As a result, the capacitive load on the clock line 70, and hence the power dissipated, are significantly reduced.

Figure 10:
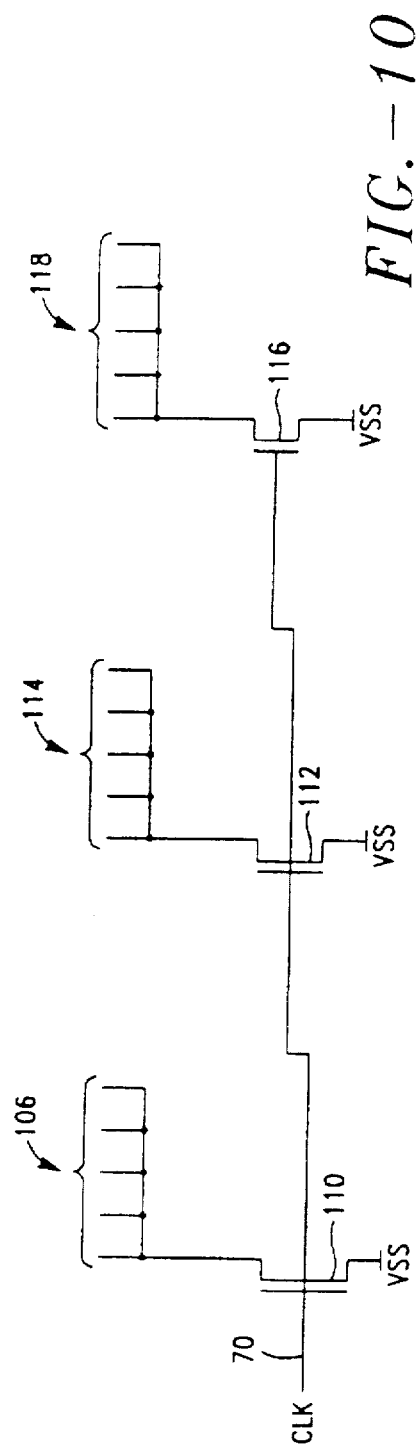
FIG. 10 is a partial schematic diagram illustrating shared and ratioed ground switches.

FIG. 10 illustrates a network ground switch structure in which multiple pre-conditioned logic elements (not shown) share a common N-channel ground switch MOSFET 110, 112, 116. The source-to-drain path of the shared ground switch is connected between the supply voltage $V_{SS}$ and logic element return lines 106, 114, 118, respectively. The gate terminal of the shared ground switch 110, 112, 116 is connected to the clock input line 70 for selectively connecting the pre-conditioned logic element return line 106, 114, 118 to the supply voltage $V_{SS}$ in response to a signal on the clock input line 70.

Return Line Pre-condition Circuits

Figure 11:
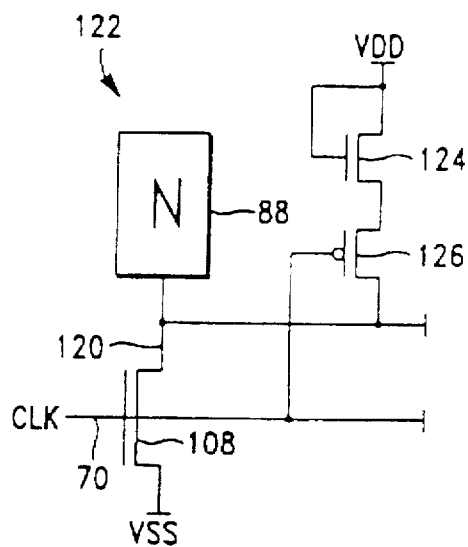
FIG. 11 is a partial schematic diagram illustrating a shared return line pre-charge circuit according to the present invention.

Another aspect of the present invention is illustrated in FIG. 11, a partial schematic diagram illustrating at least one pre-conditioned logic element return line 120 connected to a return line pre-condition circuit 122. The pre-condition circuit 122 includes an N-channel pullup MOSFET 124 having the drain and gate terminals connected to the supply voltage $V_{DD}$, and a P-channel pullup MOSFET 126 having a source terminal connected to a source terminal of the N-channel pullup MOSFET 124, a drain terminal connected to the defined pre-conditioned logic element return line 120, and a gate terminal connected to the clock input line 70. Each MOSFET of the pre-condition circuit 122 is scaled to have a width substantially less than the width of the corresponding ground switch 108.

Figure 12:
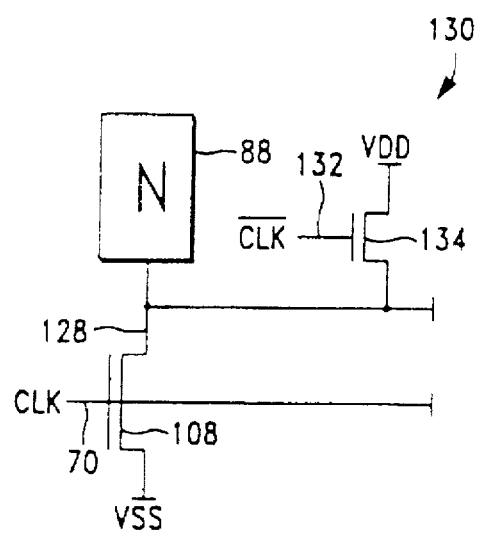
FIG. 12 is a partial schematic diagram illustrating an alternative embodiment of a shared return line pre-charge circuit.

An alternative embodiment of the return line pre-condition circuit is illustrated in FIG. 12, a partial schematic diagram showing at least one pre-conditioned logic element return line 128 connected to a return line pre-condition circuit 130. The pre-condition circuit 130 includes an inverted clock input line 132 and an N-channel pullup MOSFET 134 having a drain terminal connected to the supply voltage $V_{DD}$. A source terminal of the pullup MOSFET 134 is connected to the defined pre-conditioned logic element return line 128, and a gate terminal is connected to the inverted clock input line 132. The pullup MOSFET 134 is scaled to have a width substantially less than the width of the corresponding ground switch 108.

The purpose of each of these circuits, FIGS. 11, 12, is to precharge the shared return line 120, 128 to a level of $V_{DD}-V_m$, where $V_m$ is the threshold voltage of an N-channel MOSFET. The precharge insures that the individual P-channel pre-condition MOSFETs (90 of FIG. 9) do not have to charge the shared return lines, 120 (FIG. 11), 128 (FIG. 12), whose capacitance is large. This aspect of the invention is important when the logic element input lines cause the N-channel evaluation MOSFETs 88 to conduct even though the ground switch 108 is off. When this happens, the pre-condition MOSFET 90 (FIG. 9) "sees" the full capacitance of the shared return line 120, 128 "through" the turned on evaluation MOSFETs 88. The pre-condition MOSFET is too weak to precharge both the output line 78 (FIG. 9) and the shared return line 120, 128 during the charge phase of the clock interval. The circuits of FIGS. 11 and 12 overcome this problem.

Improved Clocking Circuit

Figure 13:
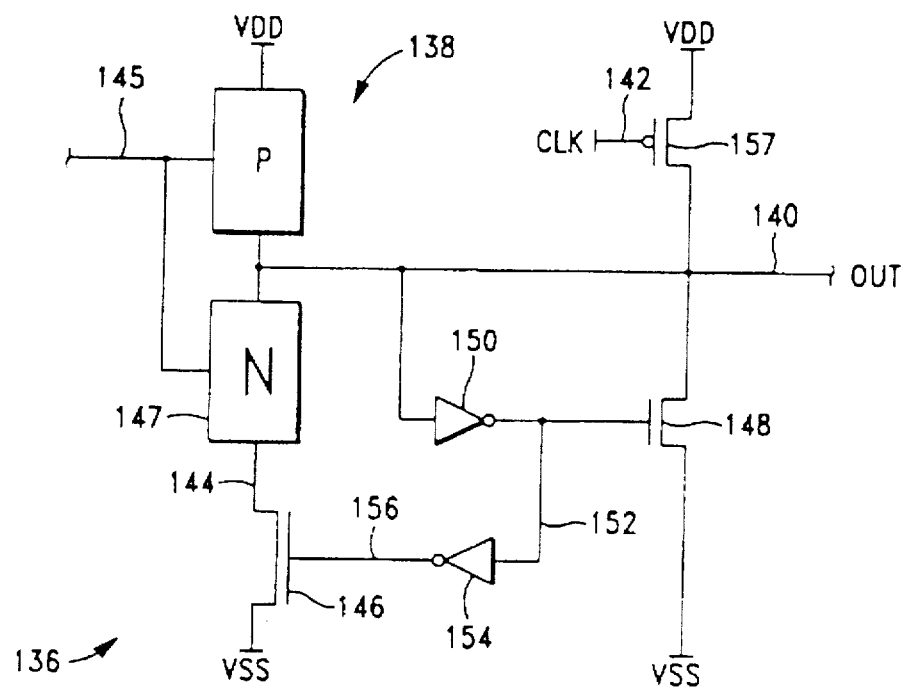
FIG. 13 is a partial schematic diagram of an alternative clocking circuit of the present invention.

FIG. 13 is a partial schematic diagram illustrating an improved clocking circuit according to another aspect of the present invention. The circuit is designated generally by the numeral 136. FIG. 13 illustrates a pre-conditioned N-type complementary CMOS logic element 138 including an output line 140, a clock input line 142, a return line 144, and an N-channel ground switch 146 connected between the supply voltage $V_{SS}$ and the return line 144.

The improvement includes an N-channel "leaker" MOSFET 148 having a very small width and a source-to-drain path connected between the supply voltage $V_{SS}$ and the logic element output line 140, a first inverter 150 having an input line connected to the logic element output line 140 and an output line 152 connected to a gate terminal of the leaker MOSFET 148, a second inverter 154 having an input line connected to the output line 152 of the first inverter 150 and an output line 156 connected to a gate terminal of the ground switch 146, and a P-channel pre-condition MOSFET 157 having a source-to-drain path connected between the supply voltage $V_{DD}$ and the output line 140 and a gate terminal connected to the clock input line 142.

The inverters 150, 154 are very small and can be any devices which provide both delay and logical complementation. For example, the inverter 150 can be replaced by a string of three or five or any odd number of inverters. Similarly for the inverter 154. In a preferred embodiment, the inverter 154 provides a significantly longer delay than the inverter 150.

In a normal clock circuit, such as illustrated in FIG. 11, the gate terminal of the ground switch 108 is connected to the clock line 70 and the ground switch 108 is turned on and off at every clock pulse. The purpose of circuit 136 is to reduce capacitive loading on the clock line and to reduce the clock line routing requirements. In FIG. 13 the clock input 142 is connected to the gate terminal of the small pre-condition MOSFET 157. The capacitive loading presented by MOSFET 157 is minimal. The clock line 142 is routed to MOSFET 157 but not to the ground switch 146.

When the clock input 142 goes low, commencing the charge phase of the clock interval, the output line 140 will be pre-conditioned high by MOSFET 157. Inverters 150 and 154 will delay the high level at the output line 140 and couple it to the gate terminal of the ground switch 146. The ground switch 146 will turn on, but the input lines 145 will be low (because they are driven by signals derived from the outputs of pre-conditioned low P-type logic elements), keeping the evaluation MOSFETs 147 off, preventing the output line 140 from discharging through the turned on ground switch 146. If, following the rising edge of the clock signal 142, the inputs 145 permit the evaluation circuit 147 to conduct, the output line 140 will be discharged. The inverters 150, 154 will delay the output line's going low and connect it to the gate terminal of the ground switch 146, turning off the ground switch. The small leaker MOSFET 148 will be on, and will keep the output line 140 at a low level. When the clock input 142 goes low again, the P-channel pre-condition MOSFET 157 will start to charge the output line 140, and is wider than the leaker 148 so that it can overcome the effect of the leaker and successfully charge the output line 140. The inverter 150 couples the high level on the charged output line 140 to the gate terminal of the leaker 148, shutting off the leaker.

The ground switch 146 will "toggle" only when the output line 140 has been discharged following the rising edge of the clock signal 142. When the inputs 145 do not permit the output line 140 to switch, the ground switch 146 remains on. The use of the improved clocking circuit 136 greatly improves power consumption and reduces clock routing complexity.

The inverters 150 and 154 must be slow enough so that by the time the output line 140 has been precharged to the high level, and that level has been propagated through the inverters 150, 154 and turning on the ground switch 146, the input line 145 has reached its pre-conditioned low level so that the evaluation circuit 147 will not conduct and discharge the output line 140. Also, the inverter 150 must be fast enough to shut off the leaker MOSFET 148 so that the output line precharge time is not extended, reducing operating speed and increasing power consumption.

Pre-conditioned P-type Complementary CMOS Logic Element

The invention will now be described with respect to FIG. 14, a schematic diagram illustrating a pre-conditioned P-type complementary CMOS logic element, according to another aspect of the invention. The logic element is identified generally by the numeral 158, uses scaled MOSFETs and a single clock phase and includes two input lines 160, 162. Logic element 158 also includes two complementary MOSFET pairs, each pair including a P-channel evaluation MOSFET and an N-channel discharge MOSFET. Each input line is connected to the gate terminals of a different complementary MOSFET pair. The logic element 158 includes a pre-conditioned output line 164 and a supply line 166.

The evaluation MOSFETs form a P-channel evaluation circuit 168 connected between the supply line 166 and the output line 164, and the discharge MOSFETs form an N-channel discharge circuit 170 connected between the output line 164 and the supply voltage $V_{SS}$ to provide a defined logical function of the input lines at the output line.

The source-to-drain path of an N-channel pre-condition MOSFET 172 is connected between the supply voltage $V_{SS}$ and the output line 164. The source-to-drain path of a P-channel supply switch MOSFET 174 is connected between the supply voltage $V_{DD}$ and the supply line 166. An inverted clock input line 176 is connected to the gate terminals of the pre-condition MOSFET 172 and the supply switch MOSFET 174.

When the clock input 176 is high, the N-channel precondition MOSFET 172 will discharge the output line 164 to a low level. Depending upon the state of the inputs 160, 162, when the clock goes low, the P-channel evaluation circuit 168 will rapidly charge the output line 164 to the $V_{DD}$ level. If the inputs 160, 162 do not permit the charging of the output line 164, the N-channel discharge circuit 170 will keep the output line 164 at the pre-conditioned low level and provide immunity against positive-going noise.

Scaled MOSFETs

Figure 14:
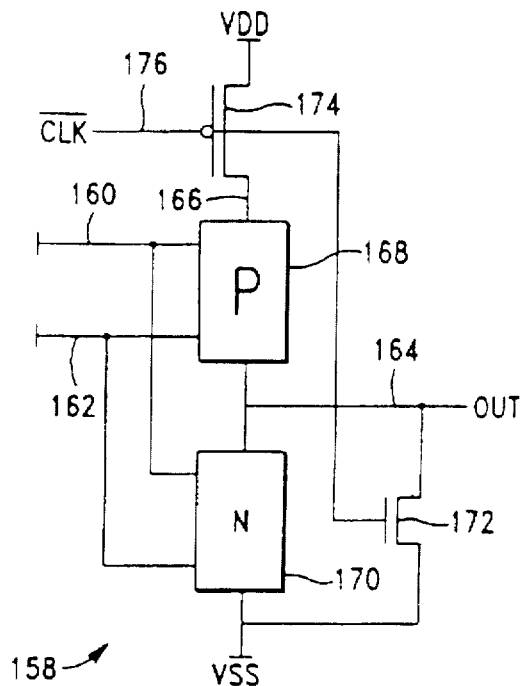
FIG. 14 is a schematic diagram of a pre-conditioned P-type complementary CMOS logic element using scaled MOSFETs and a single clock phase in accordance with the present invention.

Each of the MOSFET transistors has a width, and the width of the P-channel MOSFETs 168 is substantially greater than the width of the N-channel MOSFETs 170 as indicated in FIG. 14 by the use of the symbols "large P" and "small n", respectively. The width of the P-channel supply switch transistor 174 is approximately equal to the width of any P-channel evaluation transistor within the evaluation circuit 168. The width of the N-channel pre-condition transistor 172 is very narrow because the device need only pre-condition the output line 164 to a low level during the portion of each clock period during which the inverted clock input 176 is high.

In one preferred embodiment of the pre-conditioned P-type logic element 158, the width of the P-channel evaluation MOSFETs 168 is about 10 times the width of the N-channel discharge MOSFETs 170.

In another preferred embodiment of the pre-conditioned P-type logic element 158, the width of the P-channel MOSFETs 168 is at least 2 times the width of the N-channel MOSFETs 170.

In yet another embodiment of the pre-conditioned P-type logic element 158, the width of the P-channel MOSFETs 168 is from 2 to 100 times the width of the N-channel MOSFETs 170.

As previously stated, the width of the P-channel supply switch MOSFET 174 is essentially the same as the width of any P-channel evaluation MOSFET 168, while the width of the N-channel pre-condition MOSFET 172 is very narrow.

Static N-type Complimentary CMOS Logic Element

Figure 15:
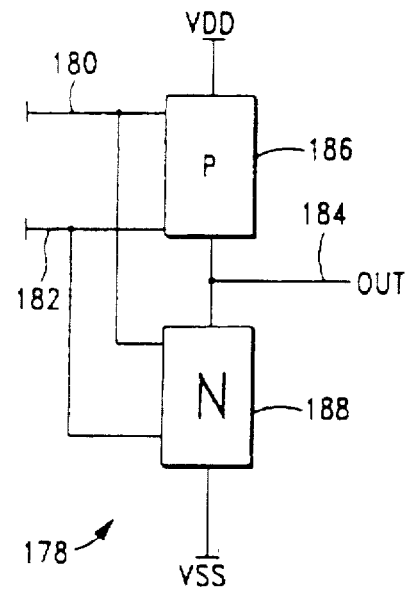
FIG. 15 is a schematic diagram of a static N-type complementary CMOS logic using scaled MOSFETs in accordance with the present invention.

FIG. 15 illustrates a static N-type complementary CMOS logic element using scaled MOSFETs according to another aspect of the present invention, and designated generally by the numeral 178. The logic element 178 uses scaled MOSFETs and includes two input lines 180, 182. Logic element 178 also includes two complementary MOSFET pairs, each pair including a P-channel charge MOSFET and an N-channel evaluation MOSFET. Each input line is connected to the gate terminals of a different MOSFET pair. The logic element 178 includes an output line 184.

The P-channel charge MOSFETs form a charge circuit 186 connected between the supply voltage $V_{DD}$ and the output line 184. The N-channel evaluation MOSFETs form an evaluation circuit 188 connected between the output line 184 and the supply voltage $V_{SS}$ to provide a defined logical function of the input lines at the output line.

Each of the MOSFET transistors in FIG. 15 has a width, and the width of the N-channel evaluation MOSFETs 188 is substantially greater than the width of the P-channel charge MOSFETs 186, as indicated by the use of the symbols "small p" and "large N", respectively.

In a preferred embodiment of the static N-type complimentary CMOS logic element 178, the width of the N-channel evaluation MOSFETs 188 is about 10 times the width of the P-channel charge MOSFETs 186.

In another preferred embodiment of the static N-type logic element 178, the width of the N-channel evaluation MOSFETs 188 is at least 2 times the width of the P-channel charge MOSFETs 186.

In yet another preferred embodiment, the width of the N-channel evaluation MOSFETs 188 is from 2 to 100 times the width of the P-channel charge MOSFETs 186.

Two-stage Pre-conditioned P-type Complementary CMOS Logic Circuit

Figure 16:
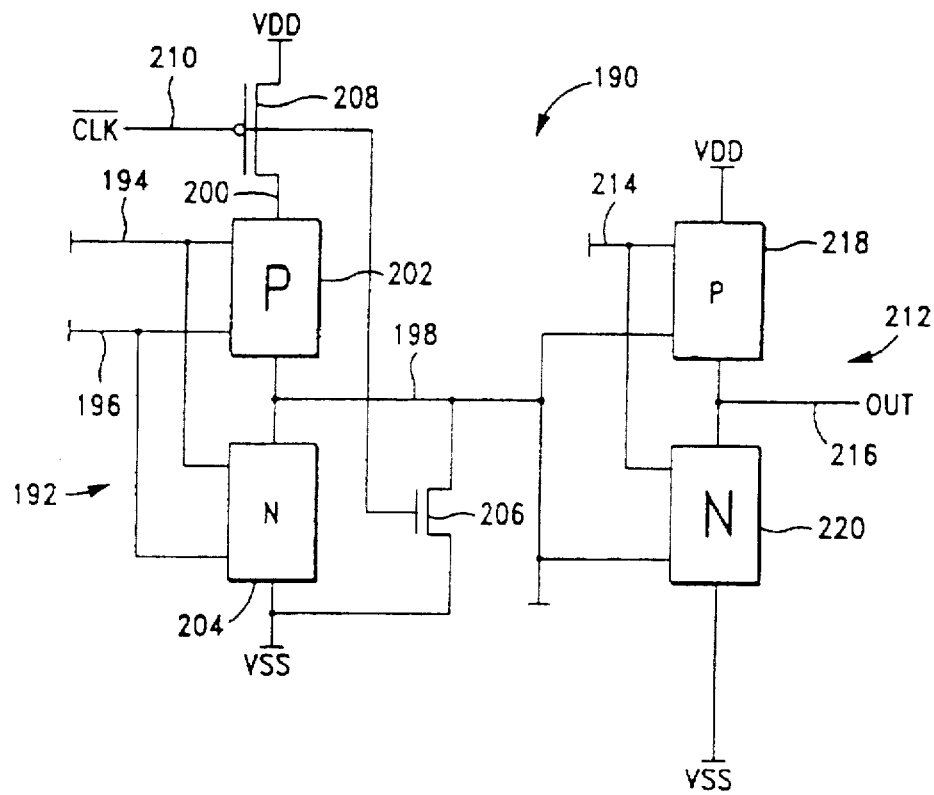
FIG. 16 is a schematic diagram of a two-stage P-type pre-conditioned complementary CMOS logic circuit using scaled MOSFETs and a single clock phase according to the present invention.

FIG. 16 illustrates a two-stage pre-conditioned P-type complementary CMOS logic circuit using scaled MOSFETs and a single clock phase, according to another aspect of the present invention. The two-stage pre-conditioned P-type logic circuit is designated generally by the numeral 190.

The logic circuit 190 includes a first stage pre-conditioned P-type logic element 192 of the type illustrated in FIG. 14 and described above. The first stage logic element 192 has two input lines 194, 196, a pre-conditioned first stage output line 198, and a supply line 200. The first stage logic element 192 is formed by two complementary MOSFET pairs. Each first stage MOSFET pair includes a P-channel evaluation MOSFET and an N-channel discharge MOSFET. Each of the two input lines 194, 196 is connected to the gate terminals of a different complementary MOSFET pair. The P-channel evaluation MOSFETs form an evaluation subcircuit 202 connected between the supply line and the first stage output line 198. The first stage N-channel discharge MOSFETs form a discharge subcircuit 204 connected between the first stage output line 198 and the supply voltage $V_{SS}$ to provide a defined logical function of the first stage input lines at the first stage output line. The first stage logic element 192 also includes an N-channel pre-condition MOSFET 206 having a source-to-drain path connected between the supply voltage $V_{SS}$ and the first stage output line 198 and a P-channel supply switch MOSFET 208 having a source-to-drain path connected between the supply voltage $V_{DD}$ and the supply line 200. The first stage logic element 192 also includes an inverted clock input line 210 connected to the gate terminals of the pre-condition MOSFET 206 and the supply switch MOSFET 208.

Each first stage MOSFET has a width, and the width of each first stage P-channel evaluation MOSFETs 202 is substantially greater than the width of each first stage N-channel discharge MOSFETs 204. The width of the P-channel supply switch MOSFET 208 is essentially equal to the width of any first stage P-channel evaluation MOSFET 202. The width of the N-channel pre-condition MOSFET 206 is very narrow for the reasons stated above with respect to FIG. 14.

The logic circuit 190 includes a second stage static N-type logic element 212 of the type illustrated in FIG. 15 and described above. The second stage logic element 212 has two second stage input lines 198, 214 and a second stage output line 216. One of the second stage input lines 198 is connected to receive the first stage output line 198. The second stage logic element 212 is formed of two second stage Complementary MOSFET pairs. Each second stage complementary pair includes a P-channel charge MOSFET and an N-channel evaluation MOSFET. Each second stage input line 198, 214 is connected to the gate terminals of a different second stage complementary pair. The P-channel charge MOSFETs form a charge subcircuit 218 and are connected between the supply voltage $V_{DD}$ and the second stage output line 216. The second N-channel stage evaluation MOSFETs form a second stage evaluation subcircuit 220 which is connected between the second stage output line 216 and the supply voltage $V_{SS}$ to provide a defined logical function of the second stage input lines at the second stage output line.

Each second stage MOSFET has a width, and the width of each second stage N-channel evaluation MOSFET 220 is substantially greater than the width of each second stage P-channel charge MOSFET 218.

In a preferred embodiment of the pre-conditioned P-type logic circuit 190, the width of the first stage P-channel evaluation MOSFETs 202 is about 10 times the width of the first stage N-channel discharge MOSFETs 204.

In another preferred embodiment of the logic circuit 190, the width of the second stage N-channel evaluation MOSFETs 220 is about 10 times the width of the second stage P-channel charge MOSFETs 218.

In another preferred embodiment of the logic circuit 190, the width of the first stage P-channel evaluation MOSFETs 202 is at least 2 times the width of the first stage N-channel discharge MOSFETs 204.

In another preferred embodiment of the logic circuit 190, the width of the second stage N-channel evaluation MOSFETs 220 is at least 2 times the width of the second stage P-channel charge MOSFETs 218.

In yet another preferred embodiment of the logic circuit 190, the width of the first stage P-channel evaluation MOSFETs 202 is from 2 to 100 times the width of the first stage N-channel discharge MOSFETs 204.

In yet another preferred embodiment of the logic circuit 190, the width of the second stage N-channel evaluation MOSFETs 220 is from 2 to 100 times the width of the second stage P-channel charge MOSFETs 218.

Inverter

As described previously, when a logic element includes a single complementary MOSFET pair and one input line, the logic element defines an INVERTER ("NOT"). The INVERTER can be either of the pre-conditioned type (FIG. 14) or of the static type (FIG. 15). In the two-stage pre-conditioned P-type logic circuit 190 illustrated in FIG. 16, either or both stages can be implemented as an INVERTER.

Network of Alternating Pre-conditioned and Static Logic Elements

Figure 17:
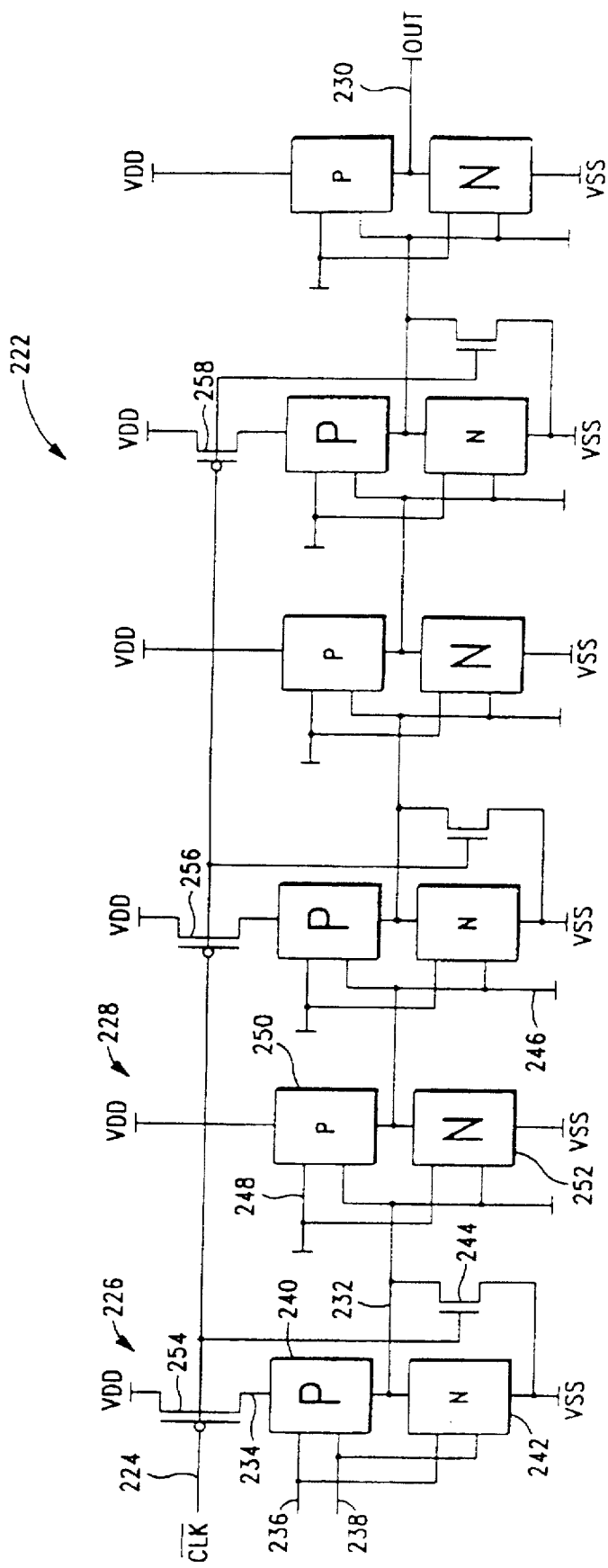
FIG. 17 is a schematic diagram of a network of interconnected alternating pre-conditioned P-type and static N-type complementary CMOS logic elements using scaled MOSFETs and a single clock phase according to the present invention and illustrating ratioed supply switches.

FIG. 17 illustrates a network of interconnected alternating pre-conditioned P-type and static N-type complementary CMOS logic elements using scaled complementary MOSFETs and a single clock phase according to another aspect of the present invention. The network is identified generally by the numeral 222.

The network 222 includes an inverted clock input line 224, a plurality of pre-conditioned P-type logic elements 226, a plurality of static N-type logic elements 228, and has at least one output line 230. The pre-conditioned P-type logic elements 226 are of the type illustrated in FIGS. 14 and 16 and described above. The static N-type logic elements 228 are of the type illustrated in FIGS. 15 and 16 and described above.

Each pre-conditioned P-type complementary CMOS logic element 226 has a pre-conditioned output line 232, a supply line 234, and at least one input line 236, 238 and provides a defined logical function of the at least one input line on the output line.

Each pre-conditioned logic element 226 is formed of interconnected complementary MOSFET pairs, each MOSFET pair includes a P-channel evaluation MOSFET and an N-channel discharge MOSFET having gate terminals connected to one of the input lines.

Each pre-conditioned logic element MOSFET has a width. The P-channel evaluation MOSFETs are scaled to have width substantially greater than the width of the paired N-channel discharge MOSFETs.

The P-channel evaluation MOSFETs form an evaluation circuit 240 connected between the supply line 234 and the pre-conditioned output line 232 and the N-channel discharge MOSFETs form a discharge circuit 242 connected between the pre-conditioned output line 232 and the supply voltage $V_{SS}$ to provide the defined logical function at the output line.

Each pre-conditioned logic element 226 also includes an N-channel pre-condition MOSFET 244 having a source-to-drain path connected between the supply voltage $V_{SS}$ and the pre-conditioned output line 232, and the gate terminal of the pre-condition MOSFET 244 is connected to the inverted clock input line 224.

Each of the static N-type complementary CMOS logic elements 228 has a static output line 246 and at least one static input line 232, 248 and provides a defined static logical function of the at least one static input line on the static output line.

Each static logic element 228 is formed of interconnected static complementary MOSFET pairs, each MOSFET pair includes a P-channel charge MOSFET and a P-channel discharge MOSFET having gate terminals connected to one of the static input lines.

Each static logic element MOSFET has a width. The N-channel evaluation MOSFETs are scaled to have width substantially greater than the width of the paired P-channel charge MOSFETs.

The P-channel charge MOSFETs form a charge circuit 250 connected between the static output line 246 and the supply voltage $V_{DD}$ and the N-channel evaluation MOSFETs form an N-type evaluation circuit 252 connected between the static output line 246 and the supply voltage $V_{SS}$ to provide the defined static logical function at the static output line.

There is at least one network output line. A single output line 230 has been designated as the network output line for the embodiment illustrated in FIG. 17. It will be appreciated that the output of any network logic element can provide a network output.

There are a plurality of network input lines 236, 238, 248. A network input line is any network logic element input line connected to a source originating outside the network.

The defined logic elements 226, 228 are interconnected to provide a defined network logical function on the network output line. The input lines are of the pre-conditioned logic elements are connected to sources selected from a group consisting of the network input lines and the static output lines.

The static input lines are connected to sources selected from a group consisting of the network input lines and the pre-conditioned output lines.

The interconnected logic elements define alternating pre-conditioned 226 and static 228 logic elements. It will be appreciated that the network 222 is illustrative only and not limiting of the scope of the invention. A typical network 222 will include hundreds or thousands of interconnected pre-conditioned 226 and static 228 logic elements and will include many network input and output lines. Logic elements which differ in type and function from those defined here can be connected to the input lines and to the output lines of network 222, but such logic elements do not form a part of the defined network 222. Nor is any logic element whose input connections differ from those specified above a part of the network 222.

Each supply line 234 is connected to the drain terminal of a P-channel supply switch MOSFET 254. The source terminal of the supply switch 254 is connected to the supply voltage $V_{DD}$, and the gate terminal of the supply switch 254 is connected to the inverted clock input line 224.

Scaled MOSFETs

In a preferred embodiment of the network 222, the width of each P-channel evaluation MOSFET 240 is about 10 times the width of the paired N-channel discharge MOSFET 242.

In a preferred embodiment of the network 222, the width of each N-channel evaluation MOSFET 252 is about 10 times the width of the paired P-channel charge MOSFET 250.

In another preferred embodiment of the network 222, the width of each P-channel evaluation MOSFET 240 is at least 2 times the width of the paired N-channel discharge MOSFET 242.

In another preferred embodiment of the network 222, the width of each N-channel evaluation MOSFET 252 is at least 2 times the width of the paired P-channel charge MOSFET 250.

In yet another preferred embodiment of the network 222, the width of each P-channel evaluation MOSFET 240 is from 2 to 100 times the width of the paired N-channel discharge MOSFET 242.

In yet another preferred embodiment of the network 222, the width of each N-channel evaluation MOSFET 252 is from 2 to 100 times the width of the paired P-channel charge MOSFET 250.

Supply Switch Connections

The supply switches may be connected to the network supply lines 234 in a variety of useful ways. A generic supply switch structure is responsive to the inverted clock input line 224 for selectively connecting each supply line 234 to the supply voltage $V_{DD}$.

In FIG. 17, a supply switch structure according to another aspect of the present invention includes at least two P-channel supply switches (three supply switches 254, 256 and 258 are illustrated) each having a drain terminal connected to a different one of the supply lines. The source terminal of each supply switch is connected to the supply voltage $V_{DD}$, and the gate terminal of each supply switch is connected to the inverted clock input line 224.

As described above with respect to FIGS. 14 and 15, the P-channel supply switch 254 of the pre-conditioned logic element 226 is scaled to have a width essentially equivalent to the width of a transistor of the P-channel evaluation circuit 240. The width of the N-channel pre-condition MOSFET 244 is very narrow. Pre-condition MOSFET 244 must be wide enough to pre-condition the output line 232 rapidly, its size determined only by the time available for the predischarge of the output line.

Shared Supply Switches

Figure 18:
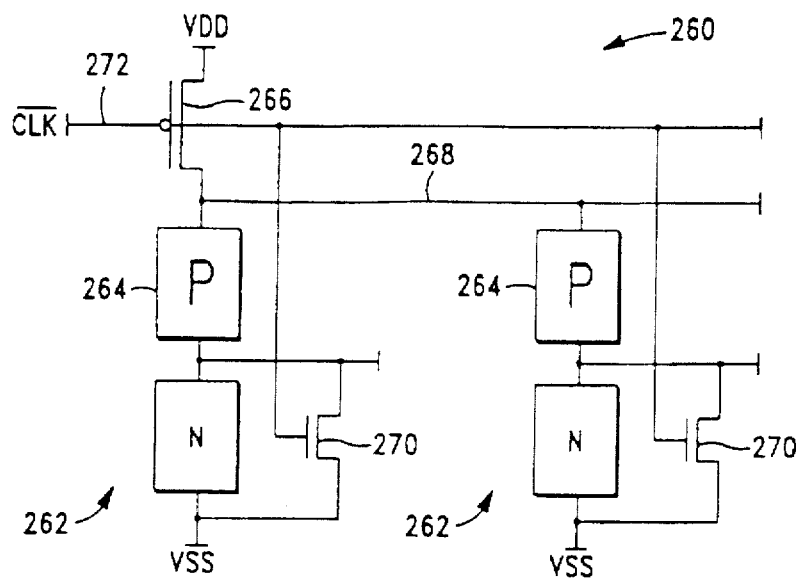
FIG. 18 is a partial schematic diagram of a pre-conditioned CMOS network illustrating a shared supply switch.
Figure 19:
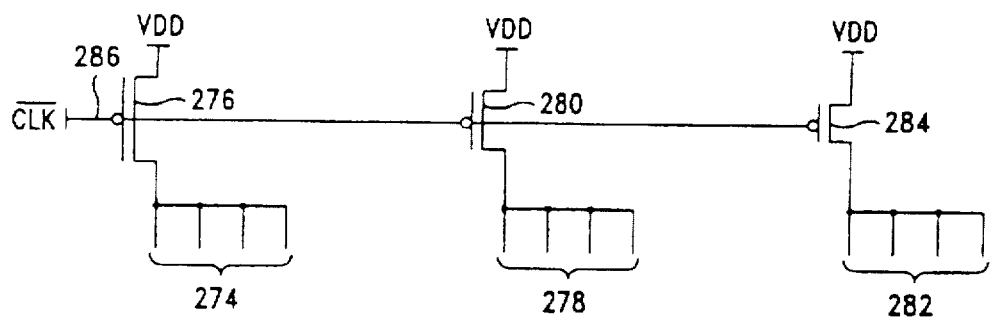
FIG. 19 is a partial schematic diagram illustrating shared and ratioed supply switches.

FIGS. 18 and 19 are partial schematic diagrams illustrating alternative embodiments of a supply switch structure according to other aspects of the present invention and include at least two pre-conditioned supply lines being connected to the drain terminal of a shared P-channel supply switch.

FIG. 18 illustrates a portion of a network 260 including two pre-conditioned P-type logic elements 262. Each pre-conditioned logic element 262 includes a P-channel evaluation circuit 264. The network 260 includes a P-channel supply switch MOSFET 266 and a common supply line 268. The evaluation circuits 264 are connected to the common supply line 268. Thus at least two pre-conditioned logic elements share the supply switch 266. Each pre-conditioned logic element 262 includes an N-channel pre-condition MOSFET 270.

The source terminal of the shared supply switch 266 is connected to the supply voltage $V_{DD}$, and the gate terminal of the shared supply switch 266 is connected to an inverted clock input line 272.

The width of the supply switch 266 is determined by the same factors relied upon to determine the width of the shared ground switch in FIG. 9, above.

FIG. 19 illustrates a network supply switch structure in which multiple pre-conditioned logic elements (not shown) share a common P-channel supply switch MOSFET 276, 280, 284. The source-to-drain path of the shared supply switch is connected between the supply voltage $V_{DD}$ and logic element return lines 274, 278 and 282, respectively. The gate terminal of the shared supply switch 276, 280, 284 is connected to an inverted clock input line 286 for selectively connecting the pre-conditioned logic element supply line 274, 278, 282 to the supply voltage $V_{DD}$ in response to a signal on the inverted clock input line 286.

Improved Clocking Circuit

Figure 20:
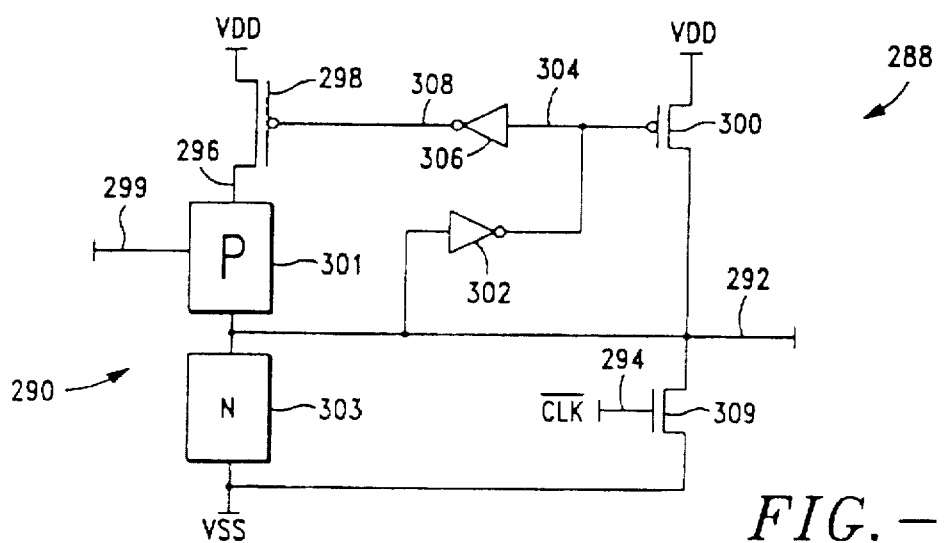
FIG. 20 is a partial schematic diagram of an alternative clocking circuit in accordance with one aspect of the present invention.

FIG. 20 is a partial schematic diagram illustrating an improved clocking circuit according to another aspect of the present invention. The circuit is designated generally by the numeral 288. FIG. 20 illustrates a pre-conditioned P-type complementary CMOS logic element 290 including a pre-conditioned output line 292, an inverted clock input line 294, a pre-conditioned supply line 296, and a P-channel supply switch 298 connected between the supply voltage $V_{DD}$ and the pre-conditioned supply line 296.

The improvement includes a P-channel "leaker" MOSFET 300 having a source-to-drain path connected between the supply voltage $V_{DD}$ and the logic element output line 292, a first inverter 302 having an input connected to the logic element output line 292 and an output 304 connected to a gate terminal of the leaker MOSFET 300, a second inverter 306 having an input connected to the output 304 of the first inverter 302 and an output 308 connected to a gate terminal of the supply switch 298, and an N-channel pre-condition MOSFET 309 connected between the supply voltage $V_{SS}$ and the pre-conditioned output line 292 and a gate terminal connected to the inverted clock input line 294.

The inverters 302 and 306 are very small devices and must provide delay. In a preferred embodiment, the delay through the inverter 306 is much greater than the delay through the inverter 302. The purpose of the circuit 290 is to reduce the capacitive loading and the routing complexity of the inverted clock line 294. When the inverted clock is high, the N-channel pre-condition MOSFET 309 predischarges the output line 292 to a low level. After a short delay, line 304 goes high and shuts off the small leaker MOSFET 300. After a longer delay, line 308 goes low and turns on the P-channel supply switch 298. Input line 299 is the output of a pre-conditioned N-type logic element and is at a high level, keeping the evaluation circuit 301 shut off. When the inverted clock input 294 goes low, the pre-condition MOSFET 309 is shut off and the discharge circuit 303 protects the output line 292 against positive-going noise. If the input 299 goes low, the strong evaluation circuit 301 will conduct, rapidly charging the output line 292. When the output line 294 goes high, after a short delay the line 304 will go low and the small leaker MOSFET 300 will turn on. After a longer delay, the line 308 goes high, shutting off the supply switch 298. The leaker MOSFET 300 keeps the output line 292 at a low level.

Method for Scaling Shared Switches

To increase the effectiveness of shared ground and supply switches, the present invention includes a method for scaling the width of a switch according to the delay experienced by input signals to the pre-conditioned stages which share the switch.

Figure 21:
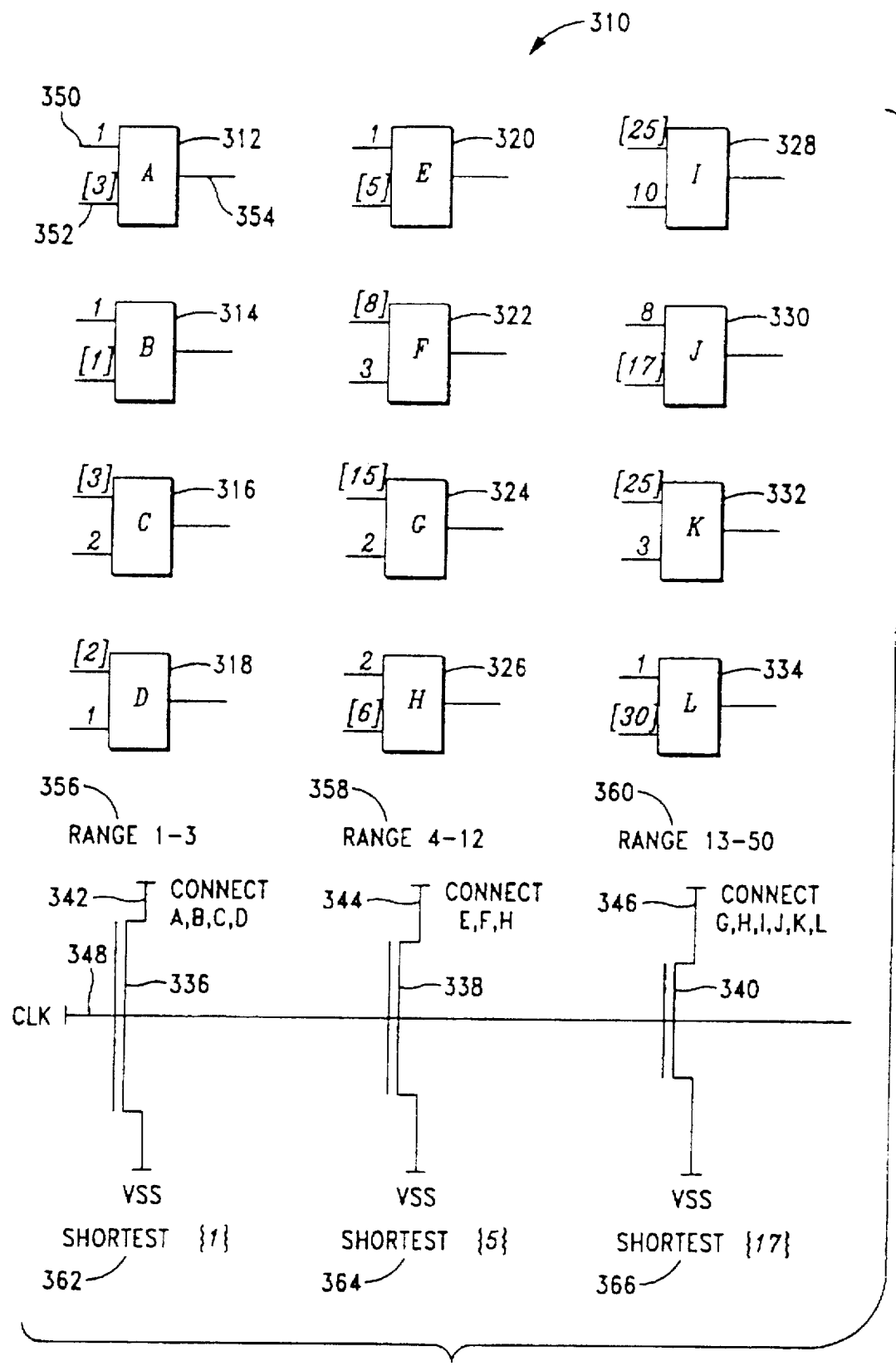
FIG. 21 is a partial schematic diagram illustrating an example of a method for scaling shared switch MOSFETs according to another aspect of the present invention.

FIG. 21 has been constructed as an illustration of this method and includes twelve boxes denominated "A" through "L", 312–334 respectively. Each box represents a pre-conditioned logic element within a partial network 310 of interconnected alternating pre-conditioned and static logic elements, according to one aspect of the present invention.

FIG. 21 also includes three ground switches 336, 338 and 340, respectively. Each ground switch has a source-to-drain path connected between the supply voltage $V_{SS}$ and common return lines 342, 344 and 346, respectively. The gate terminal of each ground switch 336, 338, 340 is connected to a clock input line 348.

Each pre-conditioned logic element 312–334 has two input lines and one output line. The network interconnections are omitted for simplification. Logic element 312 has two input lines 350, 352 and an output line 354. Logic element 312 is representative of the remaining logic elements of the partial network 310 which has been chosen to be illustrative of the scaling method. It will be appreciated that in a typical network many of the pre-conditioned logic elements will have more than two input lines.

Each pre-conditioned logic element input line in FIG. 21 is shown having an italic numeral written at the input. For example, input line 350 at logic element 312 ("A") includes the italic numeral "1", while input line 352 includes the italic numeral "[3]". The larger numeral is enclosed in brackets "[ ]" and is called the LONGEST INPUT DELAY. An examination of the remaining logic elements 31–334 ("B"–"L") reveals that every input includes an italic numeral, the larger numeral for each logic element being enclosed in brackets. An arbitrary selection of one input to logic element 314 ("B") is made since both inputs include the italic numeral "1".

The italic numerals indicate a delay measured from a predetermined reference. Thus a value "1" indicates a delay of one unit of time beyond the reference, while a value of "3" indicates a delay of three units of time beyond the reference. A similar interpretation is to be applied to the numeral included at each of the input lines of each illustrated logic element of the partial network 310.

The return lines for each of the pre-conditioned logic elements 312–334 are not shown but are understood to exist. The method described below will examine the input delays and determine which return lines are to be connected to a particular ground switch 342–346. The method will then determine a necessary width for each shared ground switch.

Three ranges of delay are illustrated in a row below the logic elements and above the ground switches in FIG. 21: "RANGE 1–3" 356, "RANGE 4–12" 358, and "RANGE 13–50" 360. The shortest of the LONGEST INPUT DELAYs common to a switch is identified in a row below the ground switches in FIG. 21 and is called the SHORTEST COMMON DELAY. The SHORTEST COMMON DELAY is in italics and is enclosed in braces "{ }" 362, 364 and 366. The significance of these ranges and of the SHORTEST COMMON DELAYs will become clear below.

The method for scaling shared switch MOSFETs includes the following steps:

1. providing a representation of a network 310 of interconnected alternating pre-conditioned and static complementary CMOS logic elements using scaled complementary MOSFETs and a single clock phase, each logic element having at least one input line carrying a signal;

2. defining a reference time;

3. defining an INPUT DELAY for a logic element input line, the INPUT DELAY being a time interval measured from the reference time to a time the signal on the logic element input line changes state;
4. determining a value for the INPUT DELAY for the input lines to the network pre-conditioned logic elements (the numerals shown in italics in FIG. 21);
5. defining a LONGEST INPUT DELAY for a logic element, the LONGEST INPUT DELAY being equal to the largest determined value of the INPUT DELAY for the input lines of the logic element;
6. determining the LONGEST INPUT DELAY for the network pre-conditioned logic elements (shown in brackets in FIG. 21);
7. defining a plurality of ranges of INPUT DELAYs (356, 358 and 360 of FIG. 21);
8. providing a plurality of switch MOSFETs (ground switches 336, 338 and 340 of FIG. 21);
9. defining a plurality of common switch MOSFETs, associating each defined common switch with a different defined range of INPUT DELAYs, and connecting to each defined common switch MOSFET the return lines of the pre-conditioned logic elements having the LONGEST INPUT DELAYs within its associated range of INPUT DELAYs (LONGEST INPUT DELAYs shown in brackets, logic elements 312, 314, 316 and 318 ("A–D") have LONGEST INPUT DELAYs falling within "RANGE 1–3" 356 and are connected to common ground switch 336);
10. defining a SHORTEST COMMON DELAY for each common switch, the SHORTEST COMMON DELAY being equal to the smallest value for the LONGEST INPUT DELAYs of the logic elements connected to the common switch (the LONGEST INPUT DELAYs for ground switch 336 are [3], [1], [3] and [2], so the SHORTEST COMMON DELAY is {1} 362. For switch 338, the LONGEST INPUT DELAYs are [5], [8] and [6], making the SHORTEST COMMON DELAY equal to {5} 364 which is the smallest value of the LONGEST INPUT DELAYs for the logic elements connected to ground switch 338);
11. defining a TURN-ON DELAY for each common switch MOSFET, the TURN-ON DELAY being a time interval measured from the reference time to the time the common switch MOSFET is fully conductive;
12. defining a relationship between the TURN-ON DELAY and the width of the common switch MOSFET; and
13. scaling the width of each common switch MOSFET to provide a TURN-ON DELAY less than the SHORTEST COMMON DELAY for the common switch, so that the common switch MOSFETs turn-on no sooner than necessary, thereby using less circuit layout area, reducing power consumption, and reducing capacitive loading on the single clock phase.

In a preferred use of the method, the step of providing a network of interconnected alternating pre-conditioned and static complementary CMOS logic elements includes the pre-conditioned logic elements being N-type and the switch MOSFETs being N-channel ground switches. An example of this method is illustrated in FIG. 21.

In another preferred use of the method, the step of providing a network of interconnected alternating pre-conditioned and static complementary CMOS logic elements includes the pre-conditioned logic elements being P-type and the switch MOSFETs being P-channel supply switches.

Methods for Routing Signals to Reduce Crosstalk

Much effort has been expended in the various aspects of the present invention to reduce noise. The pre-conditioned high (N-type) and low (P-type) output lines are sensitive to noise generated by active, switching portions of the network during the evaluation phase of each clock interval. Each clock interval is divided into a pre-condition phase and an evaluation phase. During the pre-condition phase all the pre-conditioned N-type logic element output lines, if they have previously switched to the low level, will be pre-charged back to the high level (in P-type networks, such as illustrated in FIG. 17, the opposite pre-condition will occur).

Once the output lines have been precharged to the high level, they will remain at that level until the evaluation phase. During the evaluation phase, if the logic element input lines and the logical function permit, the output line will be rapidly discharged through the evaluation network. When the input lines do not permit the output to go low, the precharged output line is vulnerable to negative-going noise coupled onto the output line. The output line is insensitive to coupled positive-going noise.

The pre-conditioned N-type logic element 72 (FIG. 8) according to the present invention uses the weak P-channel charge circuit 86 to maintain the high level on the output line 78 during the evaluation phase of the clock interval (when the clock input 70 is high). If the input lines 82, 84 do not permit the evaluation circuit 88 to discharge the output line 78, they enable the charge circuit 86 to protect the output line 78 against negative-going noise. The static P-type logic element 74 relies upon the input line 78 remaining high so that the logic element 74 does not switch at an inappropriate time. Normally, the charge circuit 86 of the N-type logic element 72 is sufficient protection to insure that negative-going noise will not cause the P-type logic element 74 to switch on noise.

In like manner, the output line 92 of the static P-type logic element 74 achieves a low level by the end of the pre-condition phase because its inputs 78, 94 are all high. The output line 92 is insensitive to negative-going noise and is sensitive to positive-going noise. Any positive-going noise on output line 92 may cause the N-type stage to which line 92 is an input to switch as a result of noise during the evaluation phase. The weak discharge circuit 96 provides protection to the output line 92 from positive-going noise. The routing methods of the present invention provide an additional level of noise protection.

The problem to be solved is one in which there are basically two classes of signal. In a first class, the signal is pre-conditioned high and must either remain high during evaluation or switch to low. In a second class, the signal is pre-conditioned low and must either remain low during evaluation or switch to high.

Signals in the first class, those carried by the output lines of the pre-conditioned N-type logic elements 72 (FIG. 8), are insensitive to coupled noise that is positive-going and are sensitive to coupled noise that is negative-going. The signals in the second class, carried by the output lines of the static P-type logic elements 74, are insensitive to negative-going noise and are sensitive to positive-going noise.

Additional reduction in noise coupling is possible by careful routing of the signal lines carrying the output signals of the N and the P-type logic elements. Since N-type signals of the first class can only switch from high to low, they produce negative-going noise when they switch. The P-type signals of the second class can only switch from low to high and produce positive-going noise when they switch.

Thus, it seems clear that the signals of a given class are sensitive to the noise generated by signals of the same class and are insensitive to the noise generated by the signals of the other class.

Therefore the following methods for routing signals in pre-conditioned logic networks of the type illustrated in FIGS. 8 and 17 will be effective in further reducing harmful noise coupled between lines.

Figure 22:
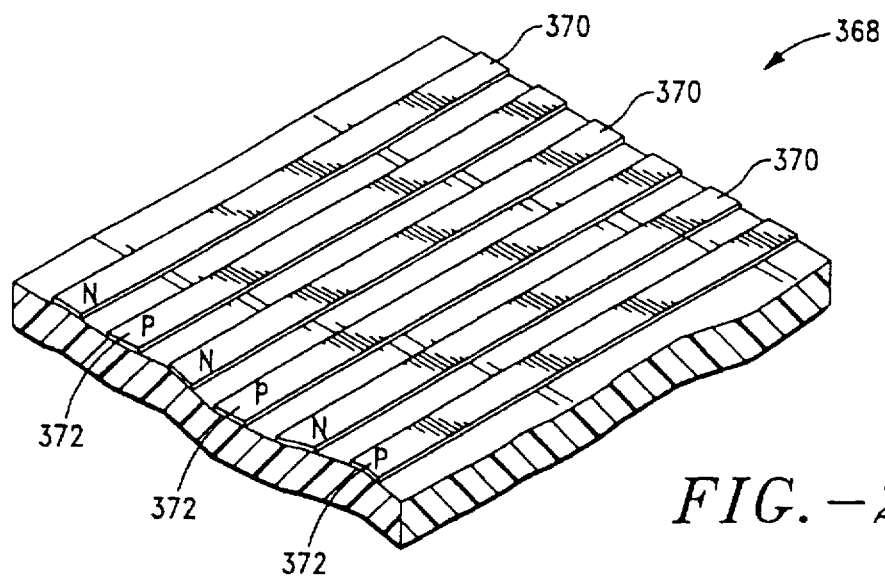
FIGS. 22–24 are partial perspective views illustrating routing of signal lines in an integrated circuit according to methods of the present invention.

FIG. 22 is a partial perspective view illustrating adjacent signal lines 370, 372 in an integrated circuit 368. The signal lines 370, 372 are routed according to one aspect of the invention. The adjacent lines are all approximately of the same width, and are spaced apart by a distance approximately equal to the line width. Signals carried by adjacent lines are supplied from complementary circuit types. Thus, signals 370 ("N") derived from N-type logic elements alternate with signals 372 ("P") derived from P-type logic elements.

A routing method for producing this result provides that in an integrated circuit including conductive lines for carrying signals, a first class of the signals being pre-conditioned to a high level and defining N-lines for carrying the first class signals, a second class of the signals being pre-conditioned to a low level and defining P-lines for carrying the second class signals, the integrated circuit including a line for carrying a clock signal, the clock signal defining a clock interval having a pre-condition phase and an evaluation phase, the first and second class signals being pre-conditioned to their respective levels during the pre-condition phase and conditionally switching to an opposite level during the evaluation phase, the first class signals being sensitive to negative-going noise and insensitive to positive-going noise during the evaluation phase, and the second class signals being sensitive to positive-going noise and insensitive to negative-going noise during the evaluation phase, a method for routing the N-lines and the P-lines to reduce noise coupling between the signals of each class, the method including the steps of:

1. providing a specification for a network of interconnected alternating pre-conditioned and static complementary CMOS logic elements using scaled complementary MOSFETs and a single clock phase, the network including logic element output lines from N-type and from P-type complementary CMOS logic elements and providing first and second class signals, respectively; and
2. implementing the specified network by routing a plurality of the logic element output lines in a plane substantially parallel to the device substrate, adjacent parallel lines alternating between N-lines and P-lines, whereby coupling between signals of the same class is minimized.

Figure 23:
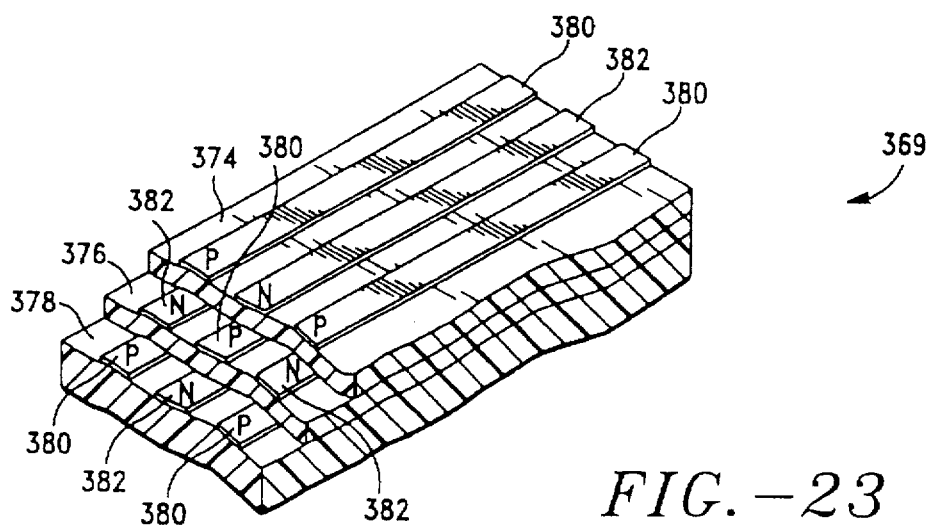

FIG. 23 is a partial perspective view illustrating a variation of the preferred signal line routing in which signal lines in adjacent levels 374, 376, 378 of a circuit 369 alternate to reduce inter-level coupling.

A routing method for producing this result provides that in an integrated circuit including conductive lines for carrying signals, a first class of the signals being pre-conditioned to a high level and defining N-lines for carrying the first class signals, a second class of the signals being pre-conditioned to a low level and defining P-lines for carrying the second class signals, the integrated circuit including a line for carrying a clock signal, the clock signal defining a clock interval having a pre-condition phase and an evaluation phase, the first and second class signals being pre-conditioned to their respective levels during the pre-condition phase and conditionally switching to an opposite level during the evaluation phase, the first class signals being sensitive to negative-going noise and insensitive to positive-going noise during the evaluation phase, and the second class signals being sensitive to positive-going noise and insensitive to negative-going noise during the evaluation phase, a method for routing the N-lines and the P-lines to reduce noise coupling between the signals of each class, the method including the steps of:

1. providing a specification for a network of interconnected alternating pre-conditioned and static complementary CMOS logic elements using scaled complementary MOSFETs and a single clock phase, the network including logic element output lines from N-type and from P-type complementary CMOS logic elements and providing first and second class signals, respectively; and
2. implementing the specified network by routing a plurality of the logic element output lines in adjacent planes substantially parallel to the device substrate, adjacent parallel lines in each plane alternating between N-lines and P-lines, and alternating between adjacent planes, whereby coupling between signals of the same class is minimized.

Figure 24:
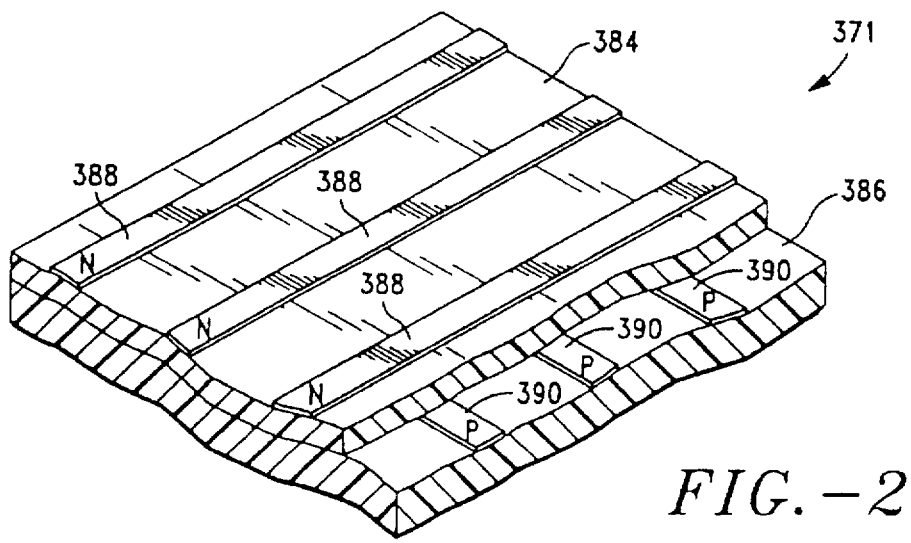

FIG. 24 is a partial perspective view of a circuit 371 illustrating another variation of the preferred signal line routing in which signals 388 derived from one type of logic element are routed within a common circuit level 384 and are spaced apart by a distance equal to at least twice the line width. Signals 390 derived from the opposite logic element type are routed in an adjacent circuit level 386 but are not parallel to the first signal lines to reduce coupling.

A routing method for producing this result provides that In an integrated circuit including conductive lines for carrying signals, a first class of the signals being pre-conditioned to a high level and defining N-lines for carrying the first class signals, a second class of the signals being pre-conditioned to a low level and defining P-lines for carrying the second class signals, the integrated circuit including a line for carrying a clock signal, the clock signal defining a clock interval having a pre-condition phase and an evaluation phase, the first and second class signals being pre-conditioned to their respective levels during the pre-condition phase and conditionally switching to an opposite level during the evaluation phase, the first class signals being sensitive to negative-going noise and insensitive to positive-going noise during the evaluation phase, and the second class signals being sensitive to positive-going noise and insensitive to negative-going noise during the evaluation phase, a method for routing the N-lines and the P-lines to reduce noise coupling between the signals of each class, the method including the steps of:

1. providing a specification for a network of interconnected alternating pre-conditioned and static complementary CMOS logic elements using scaled complementary MOSFETs and a single clock phase, the network including logic element output lines from N-type and from P-type complementary CMOS logic elements and providing first and second class signals, respectively; and
2. implementing the specified network by routing a plurality of the logic element output lines in adjacent planes substantially parallel to the device substrate, adjacent parallel lines of the same type in a plane being spaced apart, and lines of the opposite type being routed in an adjacent plane and substantially at right angles to the lines of the first type in the adjacent plane, whereby coupling between signals of the same class is minimized.

While the foregoing detailed description has described several embodiments of different aspects of the present invention, it is to be understood that the above description is illustrative only and not limiting of the disclosed invention. Thus the invention is to be limited only by the claims as set forth below.

What is claimed is:

1. A method for scaling shared switch MOSFETs, comprising the steps of:

providing a representation of a network of interconnected alternating pre-conditioned and static complementary CMOS logic elements using scaled complementary MOSFETs and a single clock phase, each pre-conditioned logic element having a return/supply line and at least one input line carrying a signal;

defining a reference time;

defining an INPUT DELAY for a logic element input line, the INPUT DELAY being a time interval measured from the reference time to a time the signal on the logic element input line changes state;

determining a value for the INPUT DELAY for the input lines to the network pre-conditioned logic elements;

defining a LONGEST INPUT DELAY for a logic element, the LONGEST INPUT DELAY being equal to the largest determined value of the INPUT DELAY for the input lines of the logic element;

determining the LONGEST INPUT DELAY for the network pre-conditioned logic elements;

defining a plurality of ranges of INPUT DELAYs;

providing a plurality of switch MOSFETs;

defining a plurality of common switch MOSFETs, associating each of the defined common switches with a different defined range of INPUT DELAYs, and connecting to each common switch the return/supply lines of the pre-conditioned logic elements having the LONGEST INPUT DELAYs within the associated range;

defining a SHORTEST COMMON DELAY for each common switch, the SHORTEST COMMON DELAY being equal to the smallest value for the LONGEST INPUT DELAYs of the logic elements connected to the common switch; defining a TURN-ON DELAY for each common switch, the TURN-ON DELAY being a time interval measured from the reference time to the time the common switch is fully conductive;

defining a relationship between the TURN-ON DELAY and the width of the common switch; and scaling the width of each common switch to provide a TURN-ON DELAY less than the SHORTEST COMMON DELAY for the common switch, whereby the common switch MOSFETs are scaled to turn-on no sooner than necessary, thereby using less circuit layout area, reducing power consumption, and reducing overall network capacitance.

2. The method of claim 1, wherein the step of providing a network of interconnected alternating pre-conditioned and static complementary CMOS logic elements includes the pre-conditioned logic elements being N-type, the switch MOSFETs being N-channel ground switches, and the return/supply lines being return lines.

3. The method of claim 1, wherein the step of providing a network of interconnected alternating pre-conditioned and static complementary CMOS logic elements includes the pre-conditioned logic elements being P-type, the switch MOSFETs being P-channel supply switches, and the return/supply lines being supply lines.

4. In an integrated circuit including conductive lines for carrying signals, a first class of the signals being pre-conditioned to a high level and defining N-lines for carrying the first class signals, a second class of the signals being pre-conditioned to a low level and defining P-lines for carrying the second class signals, the integrated circuit including a line for carrying a clock signal, the clock signal defining a clock interval having a pre-condition phase and an evaluation phase, the first and second class signals being pre-conditioned to their respective levels during the pre-condition phase and conditionally switching to an opposite level during the evaluation phase, the first class signals being sensitive to negative-going noise and insensitive to positive-going noise during the evaluation phase, and the second class signals being sensitive to positive-going noise and insensitive to negative-going noise during the evaluation phase, a method for routing the N-lines and the P-lines to reduce noise coupling between the signals of each class, the method including the steps of:

providing a specification for a network of interconnected alternating pre-conditioned and static complementary CMOS logic elements using scaled complementary MOSFETs and a single clock phase, the network including logic element output lines from N-type and from P-type complementary CMOS logic elements and providing first and second class signals, respectively;

implementing the specified network by routing a plurality of the logic element output lines in a plane substantially parallel to the device substrate, adjacent parallel lines alternating between N-lines and P-lines, whereby coupling between signals of the same class is minimized.

5. In an integrated circuit including conductive lines for carrying signals, a first class of the signals being pre-conditioned to a high level and defining N-lines for carrying the first class signals, a second class of the signals being pre-conditioned to a low level and defining P-lines for carrying the second class signals, the integrated circuit including a line for carrying a clock signal, the clock signal defining a clock interval having a pre-condition phase and an evaluation phase, the first and second class signals being pre-conditioned to their respective levels during the pre-condition phase and conditionally switching to an opposite level during the evaluation phase, the first class signals being sensitive to negative-going noise and insensitive to positive-going noise during the evaluation phase, and the second class signals being sensitive to positive-going noise and insensitive to negative-going noise during the evaluation phase, a method for routing the N-lines and the P-lines to reduce noise coupling between the signals of each class, the method including the steps of:

providing a specification for a network of interconnected alternating pre-conditioned and static complementary CMOS logic elements using scaled complementary MOSFETs and a single clock phase, the network including logic element output lines from N-type and from P-type complementary CMOS logic elements and providing first and second class signals, respectively;

implementing the specified network by routing a plurality of the logic element output lines in adjacent planes substantially parallel to the device substrate, adjacent parallel lines in each plane alternating between N-lines and P-lines, and alternating between adjacent planes, whereby coupling between signals of the same class is minimized.

6. In an integrated circuit including conductive lines for carrying signals, a first class of the signals being pre-conditioned to a high level and defining N-lines for carrying the first class signals, a second class of the signals being pre-conditioned to a low level and defining P-lines for carrying the second class signals, the integrated circuit including a line for carrying a clock signal, the clock signal defining a clock interval having a pre-condition phase and an evaluation phase, the first and second class signals being pre-conditioned to their respective levels during the pre-condition phase and conditionally switching to an opposite level during the evaluation phase, the first class signals being sensitive to negative-going noise and insensitive to positive-going noise during the evaluation phase, and the second class signals being sensitive to positive-going noise and insensitive to negative-going noise during the evaluation phase, a method for routing the N-lines and the P-lines to reduce noise coupling between the signals of each class, the method including the steps of:

providing a specification for a network of interconnected alternating pre-conditioned and static complementary CMOS logic elements using scaled complementary MOSFETs and a single clock phase, the network including logic element output lines from N-type and from P-type complementary CMOS logic elements and providing first and second class signals, respectively;

implementing the specified network by routing a plurality of the logic element output lines in adjacent planes substantially parallel to the device substrate, adjacent parallel lines of the same type in a plane being spaced apart, and lines of the opposite type being routed in an adjacent plane and substantially at right angles to the lines of the first type in the adjacent plane, whereby coupling between signals of the same class is minimized.

* * * * *